United States Patent
Yoon et al.

(10) Patent No.: US 12,009,057 B2
(45) Date of Patent: *Jun. 11, 2024

(54) SEMICONDUCTOR MEMORY DEVICE AND MEMORY SYSTEM INCLUDING THE SAME

(71) Applicant: Samsung Electronics Co., Ltd., Suwon-si (KR)

(72) Inventors: Hojun Yoon, Suwon-si (KR); Youngchul Cho, Suwon-si (KR); Youngdon Choi, Suwon-si (KR); Changsik Yoo, Suwon-si (KR); Junghwan Choi, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 18/143,967

(22) Filed: May 5, 2023

(65) Prior Publication Data

US 2023/0307022 A1 Sep. 28, 2023

Related U.S. Application Data

(63) Continuation of application No. 17/526,398, filed on Nov. 15, 2021, now Pat. No. 11,699,472.

(30) Foreign Application Priority Data

Apr. 21, 2021 (KR) .......................... 10-2021-0051584

(51) Int. Cl.
*G11C 7/22* (2006.01)
*G11C 7/10* (2006.01)

(52) U.S. Cl.
CPC ............ *G11C 7/222* (2013.01); *G11C 7/1057* (2013.01); *G11C 7/1084* (2013.01)

(58) Field of Classification Search
CPC ................................. G11C 7/222; G11C 7/22
(Continued)

(56) References Cited

U.S. PATENT DOCUMENTS 6,940,768 B2   9/2005 Dahlberg et al.
7,042,296 B2   5/2006 Hui et al.
(Continued)

FOREIGN PATENT DOCUMENTS

KR        1020120005291 A        1/2012

OTHER PUBLICATIONS

J.-H. Chae, H. Ko, J. Park and S. Kim, "A Quadrature Clock Corrector for DRAM Interfaces, With a Duty-Cycle and Quadrature Phase Detector Based on a Relaxation Oscillator," in IEEE Transactions on Very Large Scale Integration (VLSI) Systems, vol. 27, No. 4, pp. 978-982, Apr. 2019, doi: 10.1109/TVLSI.2018.2883730.*

*Primary Examiner* — Muna A Techane
(74) *Attorney, Agent, or Firm* — Muir Patent Law, PLLC

(57) ABSTRACT

A semiconductor memory device includes a quadrature error correction circuit, a clock generation circuit and a data input/output (I/O) buffer. The quadrature error correction circuit performs a locking operation to generate a first corrected clock signal and a second corrected clock signal by adjusting a skew and a duty error of a first through fourth clock signals generated based on a data clock signal and performs a relocking operation to lock the second corrected clock signal to the first corrected clock signal in response to a relock signal. The clock generation circuit generates an output clock signal and a strobe signal based on the first corrected clock signal and the second corrected clock signal. The data I/O buffer generates a data signal by sampling data (Continued)

from a memory cell array based on the output clock signal and transmits the data signal and the strobe signal to a memory controller.

19 Claims, 25 Drawing Sheets

(58) Field of Classification Search
USPC .................................................... 365/233.1
See application file for complete search history.

(56) References Cited

U.S. PATENT DOCUMENTS

| | | |
|---|---|---|
| 7,425,858 B1 | 9/2008 | Daga |
| 7,676,013 B2 | 3/2010 | Nishimura |
| 8,144,529 B2 | 3/2012 | Chuang et al. |
| 8,334,706 B2 | 12/2012 | Moon |
| 10,522,204 B1 | 12/2019 | Yu et al. |
| 11,699,472 B2 * | 7/2023 | Yoon ...................... G11C 7/222 |
| | | 365/233.1 |
| 2010/0085094 A1 * | 4/2010 | Ma ............................ H03L 7/10 |
| | | 327/158 |
| 2010/0124137 A1 * | 5/2010 | Kim .................... G11C 7/1057 |
| | | 365/219 |
| 2022/0343965 A1 * | 10/2022 | Choi ....................... G11C 29/42 |

* cited by examiner

SEMICONDUCTOR MEMORY DEVICE AND MEMORY SYSTEM INCLUDING THE SAME

CROSS-REFERENCE TO RELATED APPLICATIONS

This application is a continuation of and claims priority to U.S. patent application Ser. No. 17/526,398 filed Nov. 15, 2021, which claims the benefit of priority under 35 USC § 119 to Korean Patent Application No. 10-2021-0051584, filed on Apr. 21, 2021, in the Korean Intellectual Property Office, the disclosure disclosures of which are incorporated by reference in their entirety herein.

BACKGROUND

The present disclosure relates to memories, and more particularly to semiconductor memory devices to perform relocking operation of a quadrature error correction circuit and memory systems including the same.

A semiconductor memory device may be classified as a volatile memory device or a nonvolatile memory device. A volatile memory device refers to a memory device that loses data stored therein at power-off. As an example of a volatile memory device, a dynamic random access memory (DRAM) may be used in various devices such as a mobile system, a server, or a graphic device.

A semiconductor memory device may operate in synchronization with a clock applied from an outside. When the externally applied clock is used in the semiconductor memory device, a time delay (or a clock skew) may occur due to an internal circuit of the semiconductor memory device. A circuit may be used to compensate for the time delay and correcting duty error.

SUMMARY

Example embodiments may provide a semiconductor memory device capable of performing a relocking operation of a quadrature error correction circuit.

Example embodiments may provide a memory system including a semiconductor memory device capable of performing a relocking operation of a quadrature error correction circuit.

According to example embodiments, a semiconductor memory device includes a data clock buffer, a quadrature error correction circuit, a clock generation circuit and a data input/output (I/O) buffer. The data clock buffer configured to generate first through fourth clock signals based on a data clock signal received from a memory controller. The quadrature error correction circuit receives the first through fourth clock signals, performs a locking operation to generate a first corrected clock signal and a second corrected clock signal which have a phase difference of 90 degrees with respect to each other by adjusting at least one of a skew and a duty error of at least some of the first through fourth clock signals in a first operation mode based on an initialization command and performs a relocking operation to lock the second corrected clock signal to the first corrected clock signal in response to a relock signal in a second operation mode. The clock generation circuit generates an output clock signal and a strobe signal based on the first corrected clock signal and the second corrected clock signal. The data input/output (I/O) buffer generates a data signal by sampling data from a memory cell array based on the output clock signal and transmits the data signal and the strobe signal to the memory controller.

According to example embodiments, a memory system includes a semiconductor memory device and a memory controller to control the semiconductor memory device. The semiconductor memory device includes a data clock buffer, a quadrature error correction circuit, a clock generation circuit and a data input/output (I/O) buffer. The data clock buffer configured to generate first through fourth clock signals based on a data clock signal received from the memory controller. The quadrature error correction circuit receives the first through fourth clock signals, performs a locking operation to generate a first corrected clock signal and a second corrected clock signal which have a phase difference of 90 degrees with respect to each other by adjusting at least one of a skew and a duty error of at least some of the first through fourth clock signals in a first operation mode based on an initialization command and performs a relocking operation to lock the second corrected clock signal to the first corrected clock signal in response to a relock signal in a second operation mode. The clock generation circuit generates an output clock signal and a strobe signal based on the first corrected clock signal and the second corrected clock signal. The data input/output (I/O) buffer generates a data signal by sampling data from a memory cell array based on the output clock signal and transmits the data signal and the strobe signal to the memory controller.

According to example embodiments, a semiconductor memory device includes a data clock buffer, a quadrature error correction circuit, a duty cycle monitor, a clock generation circuit and a data input/output (I/O) buffer. The data clock buffer configured to generate first through fourth clock signals based on a data clock signal received from a memory controller. The quadrature error correction circuit receives the first through fourth clock signals, performs a locking operation to generate a first corrected clock signal and a second corrected clock signal which have a phase difference of 90 degrees with respect to each other by adjusting at least one of a skew and a duty error of at least some of the first through fourth clock signals in a first operation mode based on an initialization command and performs a relocking operation to lock the second corrected clock signal to the first corrected clock signal in response to a relock signal in a second operation mode. The duty cycle monitor monitors duty cycles of the first corrected clock signal and the second corrected clock signal in the second operation mode and configured to provide the relock signal to the quadrature error correction circuit based on a result of the monitoring. The clock generation circuit generates an output clock signal and a strobe signal based on the first corrected clock signal and the second corrected clock signal. The data input/output (I/O) buffer generates a data signal by sampling data from a memory cell array based on the output clock signal and transmits the data signal and the strobe signal to the memory controller.

Accordingly, the quadrature error correction circuit performs a locking operation to generate a first corrected clock signal and a second corrected clock signal by adjusting at least one of a skew and a duty error of at least some of the first through fourth clock signals in a first operation mode and performs a relocking operation to lock the second corrected clock signal to the first corrected clock signal in response to a relock signal. Therefore, the semiconductor memory device may quickly response to change of operating condition and may enhance performance.

BRIEF DESCRIPTION OF THE DRAWINGS

Example embodiments will be described below in more detail with reference to the accompanying drawings.

DETAILED DESCRIPTION

Various example embodiments will be described more fully hereinafter with reference to the accompanying drawings, in which example embodiments are shown.

Figure 1:
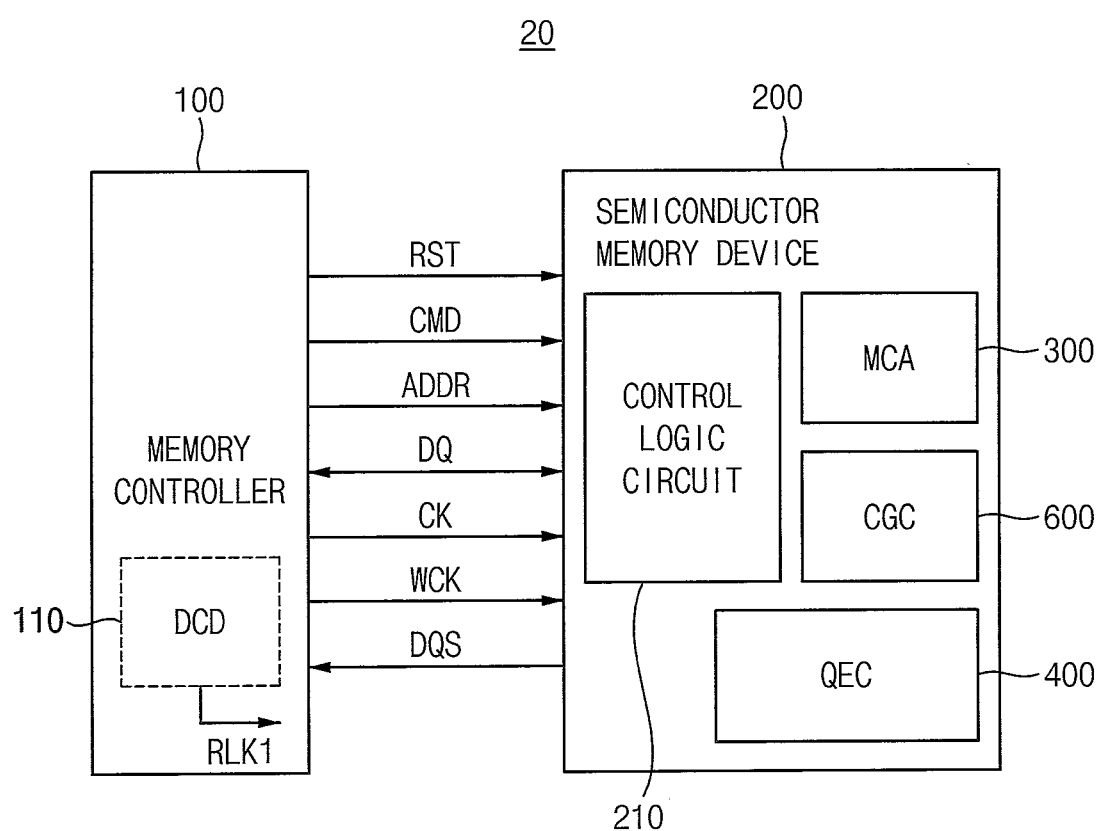
FIG. 1 is a block diagram illustrating a memory system according to example embodiments.

FIG. 1 is a block diagram illustrating a memory system 20 according to example embodiments.

Referring to FIG. 1, the memory system 20 may include a memory controller 100 and a semiconductor memory device 200.

The memory controller 100 may control overall operation of the memory system 20. The memory controller 100 may control overall data exchange between an external host and the semiconductor memory device 200. For example, the memory controller 100 may write data in the semiconductor memory device 200 or read data from the semiconductor memory device 200 in response to a request from the host.

In addition, the memory controller 100 may issue operation commands to the semiconductor memory device 200 for controlling the semiconductor memory device 200.

In some example embodiments, the semiconductor memory device 200 is a memory device including dynamic memory cells such as a dynamic random access memory (DRAM), double data rate 4 (DDR4) synchronous DRAM (SDRAM), a low power DDR4 (LPDDR4) SDRAM, or a LPDDR5 SDRAM.

The memory controller 100 transmits a clock signal CK (the clock signal CK may be referred to as a command clock signal), a command CMD, and an address (signal) ADDR to the semiconductor memory device 200. The memory controller 100 may transmit a data clock signal WCK to the semiconductor memory device 200 when the memory controller 100 transmits a write data signal DQ to the semiconductor memory device 200 or when the memory controller 100 receives a data signal DQ from the semiconductor memory device 200. The memory controller 100 may apply a reset command RST corresponding to transmitting an initialization command to the semiconductor memory device 200. The semiconductor memory device 200 may transmit data strobe signal DQS along with the data signal DQ to the memory controller 100 when the semiconductor memory device 200 transmits the data signal DQ to the memory controller 100.

The semiconductor memory device 200 includes a memory cell array (MCA) 300 that stores the data signal DQ, a control logic circuit 210, a quadrature error correction circuit (QEC) 400 and a clock generation circuit (CGC) 600.

The control logic circuit 210 may control operations of the semiconductor memory device 200. The quadrature error correction circuit 400 may generate a first corrected clock signal and a second corrected clock signal which have a phase difference of 90 degrees with respect to each other by adjusting at least a skew and a duty error of at least some of first through fourth clock signals which are generated based on the data clock signal WCK. The clock generation circuit 600 may generate an output clock signal and the strobe signal DQS based on the first corrected clock signal and the second corrected clock signal.

The quadrature error correction circuit 400 may perform a locking operation to generate the first corrected clock signal and the second corrected clock signal by adjusting at least one of a skew and a duty error of at least some of the first through fourth clock signals in a first operation mode based on an initialization command and may perform a relocking operation to lock the second corrected clock signal to the first corrected clock signal in response to a relock signal in a second operation mode during a normal operation. The normal operation may refer to one of a read operation and a write operation. The normal operation condition may be predetermined by users or standard specifications.

The memory controller 100 may include a duty cycle detector (DCD) 110. The duty cycle detector 110 may detect a duty cycle of the strobe signal DQS periodically or non-periodically and may transmit, to the semiconductor memory device 200, a command including a relock signal RLK1 designating the relocking operation based on the detected duty cycle.

The semiconductor memory device 200 may perform the relocking operation based on the relock signal RLK1 or a relock signal (e.g., RLK2 and RLK3) generated internally in the semiconductor memory device 200.

Figure 2:
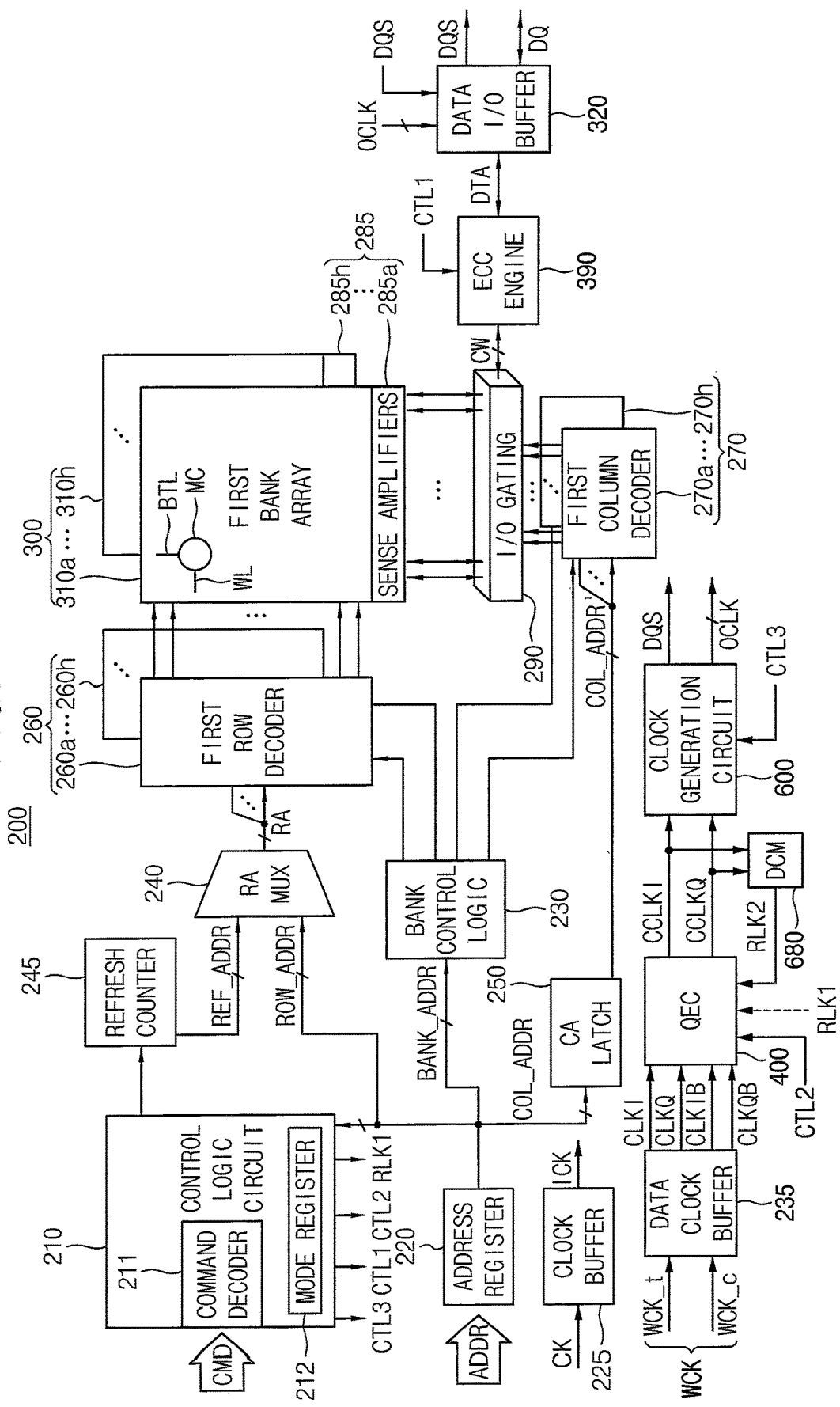
FIG. 2 is a block diagram illustrating the semiconductor memory device in FIG. 1 according to example embodiments.

FIG. 2 is a block diagram illustrating the semiconductor memory device 200 in FIG. 1 according to example embodiments.

Referring to FIG. 2, the semiconductor memory device 200 may include the control logic circuit 210, an address register 220, a bank control logic 230, a refresh counter 245, a row address multiplexer 240, a column address latch 250, a row decoder 260, a column decoder 270, the memory cell array 300, a sense amplifier unit 285, an I/O gating circuit 290, an error correction code (ECC) engine 390, a clock buffer 225, a data clock buffer 235, the quadrature error correction circuit 400, a clock generation circuit 600, a duty cycle monitor (DCM) 680 and a data I/O buffer 320.

The memory cell array 300 includes first through eighth bank arrays 310a~310h. The row decoder 260 includes first through eighth row decoders 260a~260h respectively coupled to the first through eighth bank arrays 310a~310h, the column decoder 270 includes first through eighth column decoders 270a~270h respectively coupled to the first through eighth bank arrays 310a~310h, and the sense amplifier unit 285 includes first through eighth sense amplifiers 285a~285h respectively coupled to the first through eighth bank arrays 310a~310h.

The first through eighth bank arrays 310a~310h, the first through eighth row decoders 260a~260h, the first through eighth column decoders 270a~270h and first through eighth sense amplifiers 285a~285h may form first through eighth banks. Each of the first through eighth bank arrays 310a~310h includes a plurality of memory cells MC formed at intersections of a plurality of word-lines WL and a plurality of bit-line BTL.

The address register 220 may receive the address ADDR including a bank address BANK_ADDR, a row address ROW_ADDR and a column address COL_ADDR from the memory controller 100. The address register 220 may provide the received bank address BANK_ADDR to the bank control logic 230, may provide the received row address ROW_ADDR to the row address multiplexer 240, and may provide the received column address COL_ADDR to the column address latch 250.

The bank control logic 230 may generate bank control signals in response to the bank address BANK_ADDR. One of the first through eighth row decoders 260a~260h corresponding to the bank address BANK_ADDR is activated in response to the bank control signals, and one of the first through eighth column decoders 270a~270h corresponding to the bank address BANK_ADDR is activated in response to the bank control signals.

The row address multiplexer 240 may receive the row address ROW_ADDR from the address register 220, and may receive a refresh row address REF ADDR from the refresh counter 245. The row address multiplexer 240 may selectively output the row address ROW_ADDR or the refresh row address REF ADDR as a row address RA. The row address RA that is output from the row address multiplexer 240 is applied to the first through eighth row decoders 260a~260h.

The refresh counter 245 may sequentially increase or decrease the refresh row address REF ADDR under control of the control logic circuit 210.

The activated one of the first through eighth row decoders 260a~260h, by the bank control logic 230, may decode the row address RA that is output from the row address multiplexer 240, and may activate a word-line corresponding to the row address RA. For example, the activated bank row decoder applies a word-line driving voltage to the word-line corresponding to the row address.

The column address latch 250 may receive the column address COL_ADDR from the address register 220, and may temporarily store the received column address COL_ADDR. In some embodiments, in a burst mode, the column address latch 250 may generate column address COL_ADDR' that increments from the received column address COL_ADDR. The column address latch 250 may apply the temporarily stored or generated column address COL_ADDR' to the first through eighth column decoders 270a~270h.

The activated one of the first through eighth column decoders 270a~270h activates a sense amplifier corresponding to the bank address BANK_ADDR and the column address COL_ADDR through the I/O gating circuit 290.

The I/O gating circuit 290 may include a circuitry for gating input/output data, and may further include input data mask logic, read data latches for storing data that is output from the first through eighth bank arrays 310a~310h, and write drivers for writing data to the first through eighth bank arrays 310a~310h.

Codeword CW read from one bank array of the first through eighth bank arrays 310a~310h is sensed by a sense amplifier coupled to the one bank array from which the data is to be read, and is stored in the read data latches. The codeword CW stored in the read data latches may be provided to the data I/O buffer 320 as data DTA after ECC decoding is performed on the codeword CW by the ECC engine 390. The data I/O buffer 320 may convert the data DTA into the data signal DQ based on output clock signals OCLK and may transmit the data signal DQ along with the strobe signal DQS to the memory controller 100.

The data signal DQ to be written in one bank array of the first through eighth bank arrays 310a~310h may be provided to the data I/O buffer 320 from the memory controller 100. The data I/O buffer 320 may convert the data signal DQ to the data DTA and may provide the data DTA to the ECC engine 390. The ECC engine 390 may perform an ECC encoding on the data DTA to generate parity bits, and the ECC engine 390 may provide the codeword CW including data DQ and the parity bits to the I/O gating circuit 290. The I/O gating circuit 290 may write the codeword CW in a sub-page in one bank array through the write drivers.

The data I/O buffer 320 may provide the data signal DQ from the memory controller 100 to the ECC engine 390 by converting the data signal DQ to the data DTA in a write operation of the semiconductor memory device 200 and may convert the data DTA to the data signal DQ from the ECC engine 390 based on the output clock signals OCLK from the clock generation circuit 600, and may transmit the data signal DQ and the strobe signal DQS to the memory controller 100 in a read operation of the semiconductor memory device 200. The data I/O buffer 320 may output the data signal DQ to the outside based on the output clock signals OCLK in the read operation.

The ECC engine 390 may perform an ECC encoding and an ECC decoding on the data DTA based on a first control signal CTL1 from the control logic circuit 210.

The clock buffer 225 may receive the clock signal CLK, may generate an internal clock signal ICK by buffering the clock signal CLK, and may provide the internal clock signal ICK to circuit components processing the command CMD and the address ADDR.

The data clock buffer 235 may receive the data clock signal WCK including differential clock signal pair WCK t and WCK c, may generate first through fourth clock signals CLKI, CLKQ, CLKIB and CLKQB based on the data clock signal WCK and may provide the first through fourth clock signals CLKI, CLKQ, CLKIB and CLKQB to the quadrature error correction circuit 400.

The quadrature error correction circuit 400 may perform a locking operation to generate a first corrected clock signal CCLKI and a second corrected clock signal CCLKQ which have a phase difference of 90 degrees with respect to each other by adjusting at least one of a skew and a duty error of at least some of the first through fourth clock signals CLKI, CLKQ, CLKIB and CLKQB in a first operation mode corresponding to the initialization command and may provide the first corrected clock signal CCLKI and the second corrected clock signal CCLKQ to the clock generation circuit 600. The quadrature error correction circuit 400 may perform a relocking operation to lock the second corrected clock signal CCLKQ to the first corrected clock signal CCLKI by correcting a skew between the first corrected clock signal CCLKI and the second corrected clock signal CCLKQ and duty errors of the first corrected clock signal CCLKI and the second corrected clock signal CCLKQ based on a relock signal RLK1, RLK2, or RLK3 in a second operation mode during a normal operation.

The clock generation circuit 600 may generate the output clock signal OCLK and the strobe signal DQS based on the first corrected clock signal CCLKI and the second corrected clock signal CCLKQ and may provide the output clock signal OCLK and the strobe signal DQS to the data I/O buffer 320.

The control logic circuit 210 may control operations of the semiconductor memory device 200. For example, the control logic circuit 210 may generate control signals for the semiconductor memory device 200 in order to perform a write operation or a read operation. The control logic circuit 210 includes a command decoder 211 that decodes the command CMD received from the memory controller 100 and a mode register 212 that sets an operation mode of the semiconductor memory device 200.

For example, the command decoder 211 may generate the control signals corresponding to the command CMD by decoding a write enable signal, a row address strobe signal, a column address strobe signal, a chip select signal, etc. The control logic circuit 210 may generate the first control signal CTL1 to control the ECC engine 390, a second control signal CTL2 to control the quadrature error correction circuit 400 and a third control signal CTL3 to control the clock generation circuit 600. The command decoder 211, in response to the command CMD designating the relocking operation, may apply the relock signal RLK1 to the quadrature error correction circuit 400 in the second operation mode. The command decoder 211 may apply the relock signal RLK1 to the quadrature error correction circuit 400 periodically or non-periodically in the second operation mode.

The duty cycle monitor 680 may monitor duty cycles of the first corrected clock signal CCLKI and the second corrected clock signal CCLKQ in the second operation mode and may provide the relock signal RLK2 to the quadrature error correction circuit 400 based on a result of the monitoring. The duty cycle monitor 680 may apply the relock signal RLK2 to the quadrature error correction circuit 400 periodically or non-periodically in the second operation mode.

The quadrature error correction circuit 400 may perform the locking operation based on the second control signal CTL2 in the first operation mode and may perform the relocking operation based on the relock signals RLK1 and RLK2.

Figure 3:
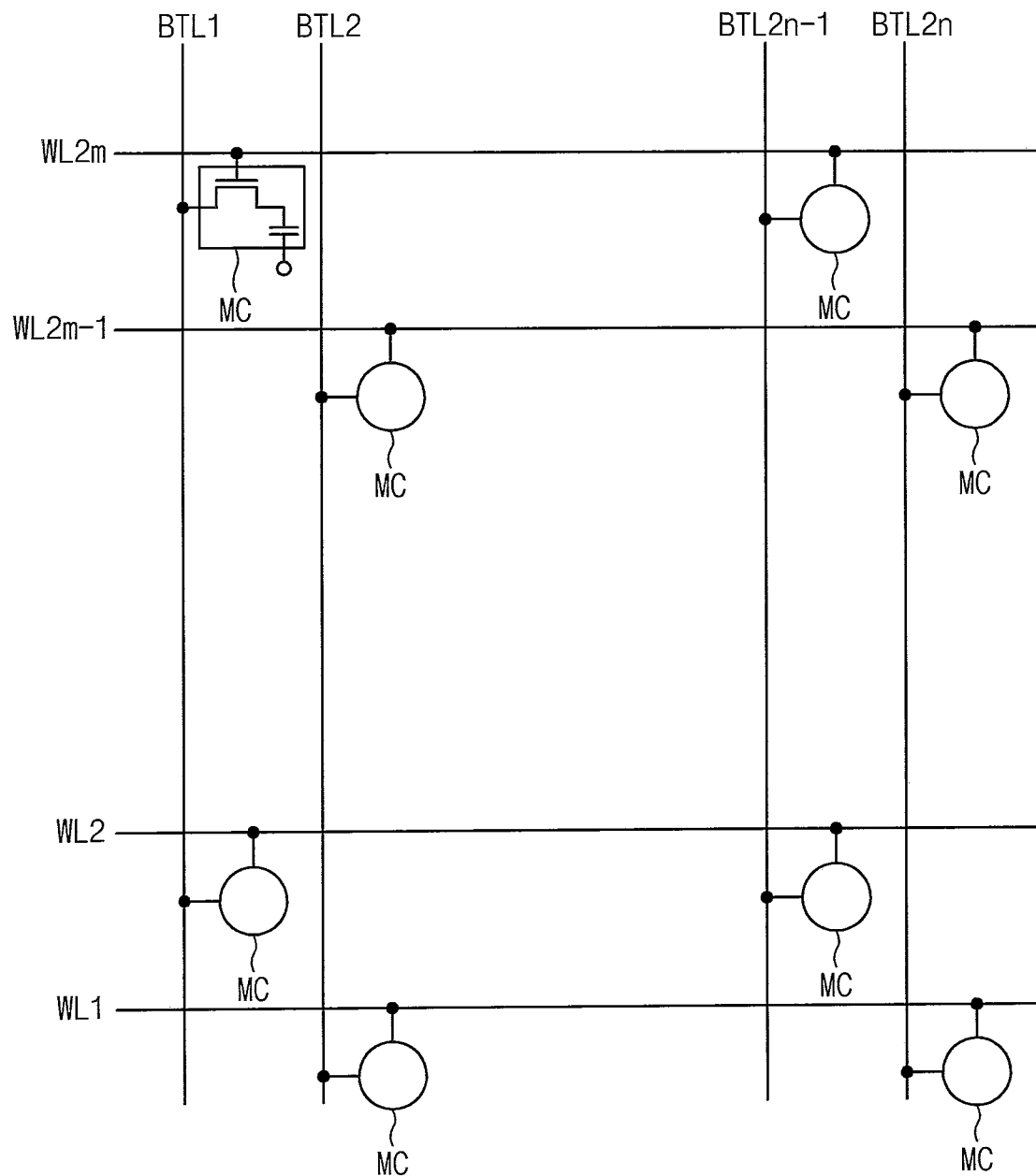
FIG. 3 illustrates an example of the first bank array in the semiconductor memory device of FIG. 2.

FIG. 3 illustrates an example of the first bank array 310 in the semiconductor memory device of FIG. 2.

Referring to FIG. 3, the first bank array 310 includes a plurality of word-lines WL1~WLm (m is a natural number greater than two), a plurality of bit-lines BTL1~BTLn (n is a natural number greater than two), and a plurality of memory cells MCs disposed at intersections between the word-lines WL1~WLm and the bit-lines BTL1~BTLn. Each of the memory cells MCs includes a cell transistor coupled to each of the word-lines WL1~WLm and each of the bit-lines BTL1~BTLn and a cell capacitor coupled to the cell transistor.

The word-lines WL1~WLm coupled to the plurality of memory cells MCs may be referred to as rows of the first bank array 310 and the bit-lines BTL1~BTLn coupled to the plurality of memory cells MCs may be referred to as columns of the first bank array 310.

Figure 4:
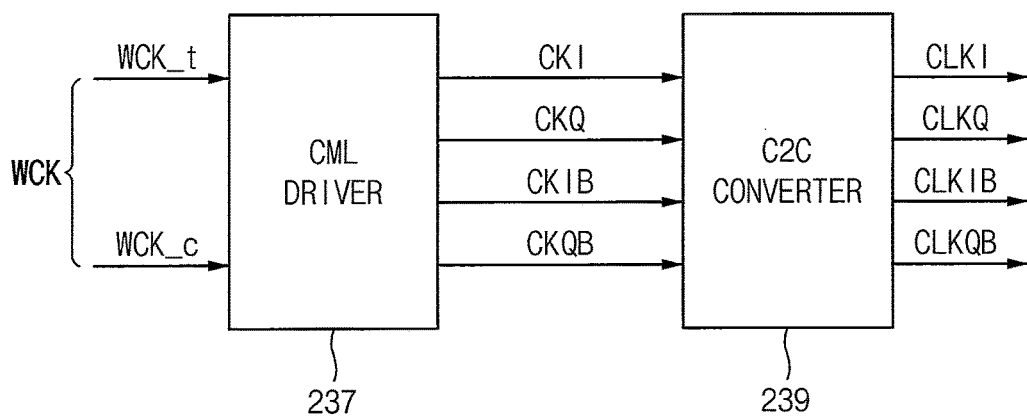
FIG. 4 is a block diagram illustrating an example of the data clock buffer in the semiconductor memory device of FIG. 2 according to example embodiments.

FIG. 4 is a block diagram illustrating an example of the data clock buffer 235 in the semiconductor memory device of FIG. 2 according to example embodiments.

Referring to FIG. 4, the data clock buffer 235 may include a current mode logic (CML) driver 237 and a CIVIL to complementary metal-oxide semiconductor (CMOS) level (C2C) converter 239.

The CIVIL driver 237 may drive the data clock signal WCK, which includes differential clock signal pair WCK t and WCK c having a CML level, to generate internal clock signals CKI, CKQ, CKIB and CKQB which have a phase difference of 90 degrees with respect to one another. The C2C converter 239 may generate, based on the internal clock signals CKI, CKQ, CKIB and CKQB, the first through fourth clock signals CLKI, CLKQ, CLKIB and CLKQB which have a phase difference of 90 degrees with respect to one another, and which also have a CMOS level. The C2C converter 239 may provide first through fourth clock signals CLKI, CLKQ, CLKIB and CLKQB to the quadrature error correction circuit 400 in FIG. 2.

Figure 5:
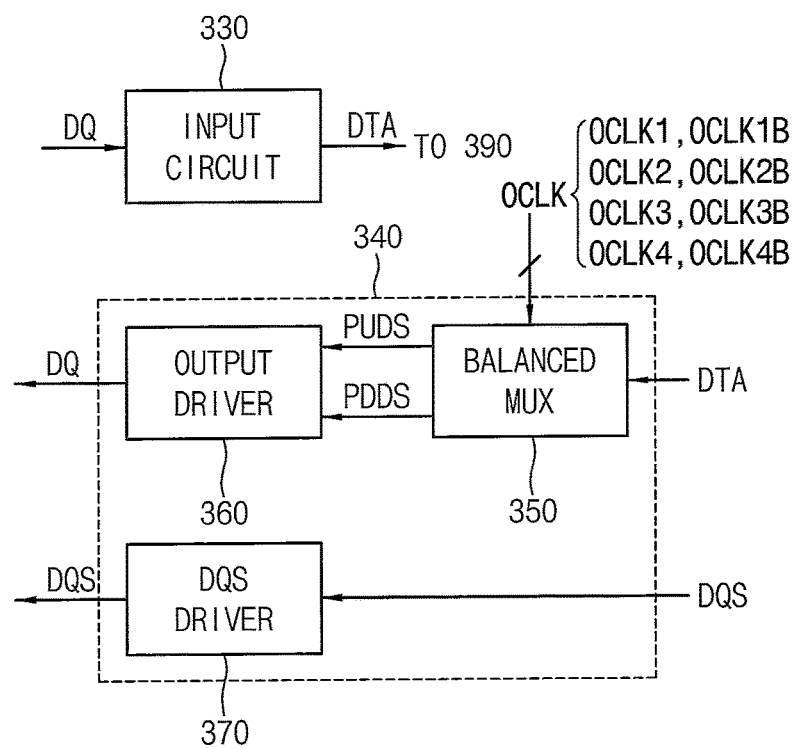
FIG. 5 illustrates an example of the data I/O buffer in the semiconductor memory device of FIG. 2 according to example embodiments.

FIG. 5 illustrates an example of the data I/O buffer 320 in the semiconductor memory device of FIG. 2 according to example embodiments.

Referring to FIG. 5, the data I/O buffer 320 may include a data input circuit 330 and a data output circuit 340. The data output circuit 340 may include a balanced multiplexer 350, an output driver 360 and a strobe (DQS) driver 370.

The data input circuit 330 may receive the data signal DQ from the memory controller 100, may convert the data signal DQ to the data DTA, and may provide the data DTA to the ECC engine 390. The data output circuit 340 may convert data DTA from the ECC engine 390 to the data signal DQ and provide the data signal DQ to the memory controller 30.

The balanced multiplexer 350 may receive the data DTA and the output clock signal OCLK, may generate a pull-up driving signal PUDS and a pull-down driving signal PDDS based on the data DTA and the output clock signal OCLK, and may provide the pull-up driving signal PUDS and the pull-down driving signal PDDS to the output driver 360. The balanced multiplexer 350 may generate the pull-up driving signal PUDS and the pull-down driving signal PDDS by sampling the data DTA based on the output clock signal OCLK. The output clock signal OCLK may include first through fourth output clock signals pairs OCLK1 and OCLKB1, OCLK2 and OCLKB2, OCLK3 and OCLKB3 and OCLK4 and OCLKB4. Each of the first through fourth output clock signals pairs OCLK1 and OCLKB1, OCLK2 and OCLKB2, OCLK3 and OCLKB3 and OCLK4 and OCLKB4 may have a phase difference of 180 degrees with respect to each other.

For example, when the data DTA is at a high level, the balanced multiplexer 350 may generate the pull-up driving signal PUDS and the pull-down driving signal PDDS for turning off all transistors included in a pull-down driver (such as a pull-down driver 363 shown in FIG. 6) of the output driver 360. Contrarily, when the data DTA is at a low level, the balanced multiplexer 350 may generate the pull-down driving signal PDDS and the pull-up driving signal PUDS for turning off all transistors included in a pull-up driver (such as a pull-up driver 361 shown in FIG. 6) of the output driver 360.

Figure 6:
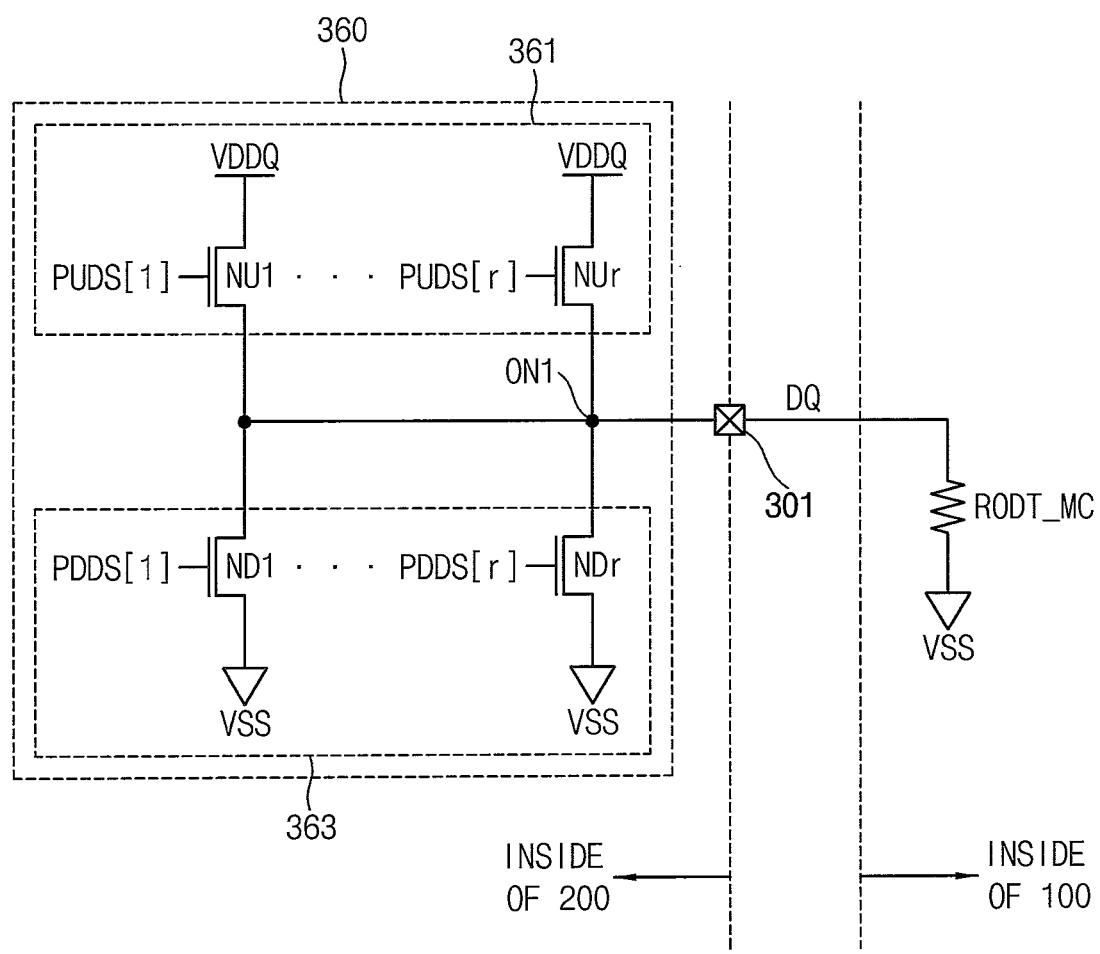
FIG. 6 illustrates a circuit diagram of an output driver in the data I/O buffer in FIG. 5 according to example embodiments.

FIG. 6 illustrates a circuit diagram of an output driver 360 in the data I/O buffer in FIG. according to example embodiments.

Referring to FIG. 6, the output driver 360 may include the pull-up driver 361 and the pull-down driver 363.

The pull-up driver 361 may include first through r-th (r is a natural number greater than one) pull-up transistors NU1 through NUr connected between the power supply voltage VDDQ and an output node ON1. Each of the first through r-th pull-up transistors NU1 through NUr may be an n-channel metal oxide semiconductor (NMOS) transistor. The pull-down driver 363 may include first through r-th pull-down transistors ND1 through NDr connected between the output node ON1 and a ground voltage VSS. Each of the first through r-th pull-down transistors ND1 through NDr may be an NMOS transistor.

When the data DTA is at the high level, the pull-up driver 361 may receive the pull-up driving signal PUDS (e.g., PUDS[1] through PUDS[r]) corresponding to a pull-up control code PUCD from the balanced multiplexer 350 and may generate the current determined by the pull-up control code PUCD. The pull-down transistors ND1 through NDr included in the pull-down driver 363 may all be turned off according to the pull-down driving signal PDDS (e.g., PDDS [1] through PDDS[r]).

At this time, when the data DTA is at the high level, the current generated by the pull-up driver 361 may be transmitted to an on-die termination (ODT) resistor RODT_MC in the memory controller 100 via the data I/O (or DQ) pad 301. The data signal DQ that the ODT resistor RODT_MC receives is determined by the current generated by the pull-up driver 361 and the ODT resistor RODT_MC.

When the data DTA is at the low level, the pull-up transistors NU1 through NUr included in the pull-up driver 361 may all be turned off according to the pull-up driving signal PUDS. The pull-down driver 363 may receive the pull-down driving signal PDDS corresponding to the pull-down control code PDCD from the balanced multiplexer 350 and may have a resistance determined by the pull-down control code PDCD.

At this time, when the data DTA is at the low level, no current is generated by the pull-up driver 361, and therefore, the data signal DQ that the ODT resistor RODT_MC receives has an output low level voltage (VOL) voltage which is substantially the same as the ground voltage VS S.

According to example embodiments, the total resistance, e.g., a termination resistance (RTT), of the pull-up driver 361 or the pull-down driver 363 may be changed in response to a particular pull-up or pull-down driving signal PUDS or PDDS.

Figure 7:
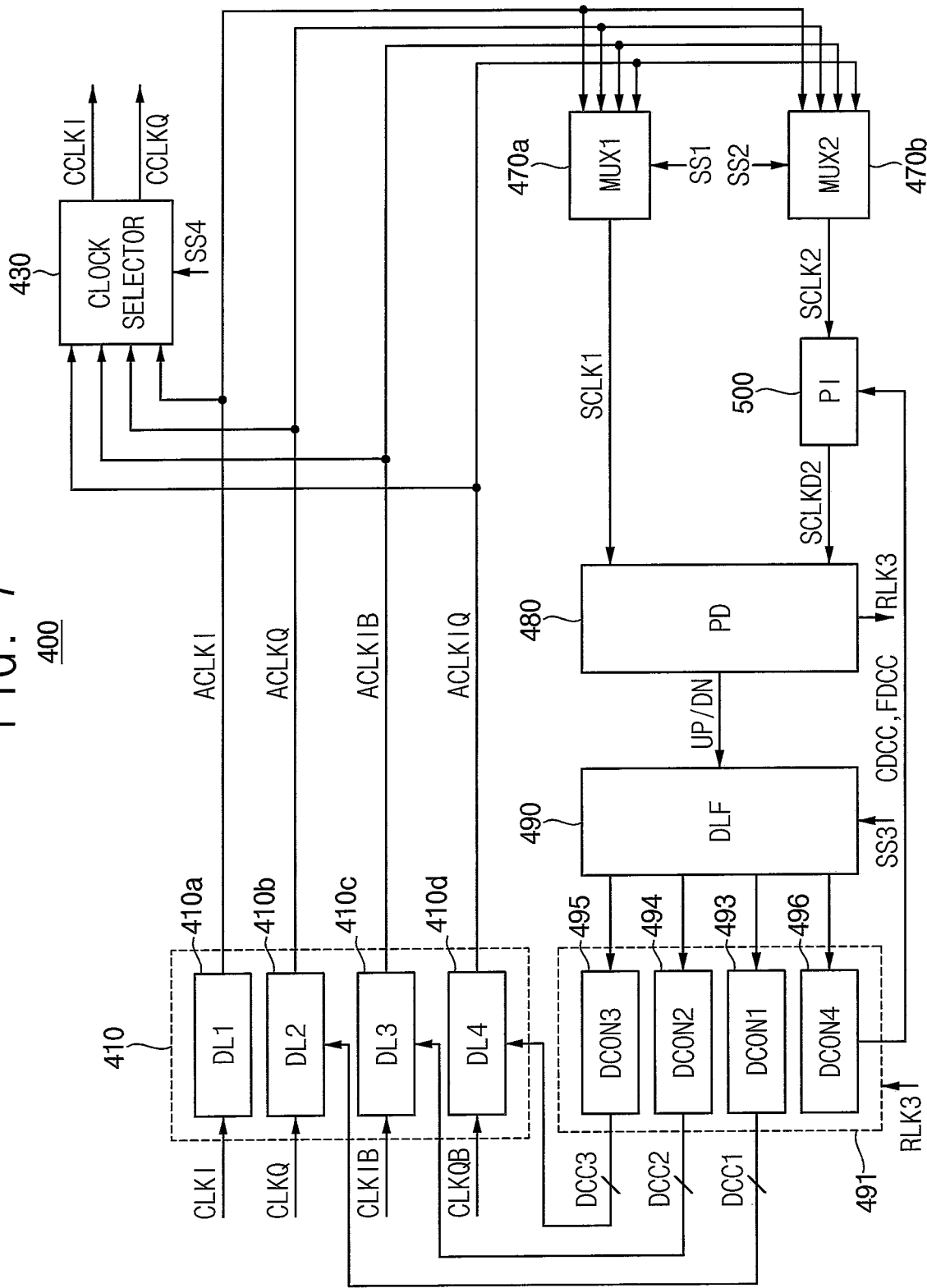
FIG. 7 is a block diagram illustrating an example of the quadrature error correction circuit in the semiconductor memory device of FIG. 2 according to example embodiments.

FIG. 7 is a block diagram illustrating an example of the quadrature error correction circuit 400 in the semiconductor memory device of FIG. 2 according to example embodiments.

Referring to FIG. 7, the quadrature error correction circuit 400 may include a delay circuit 410, a clock selector 430, a first multiplexer (MUX1) 470a, a second multiplexer (MUX2) 470b, a phase interpolator (PI) 500, a phase detector (PD) 480, a digital loop filter 490 and a delay control circuit 491.

The delay control circuit 491 may include a first delay controller DCON1 493, a second delay controller DCON2 494, a third delay controller DCON3 495 and a fourth delay controller DCON4 496.

The delay circuit 410 may receive the first through fourth clock signals CLKI, CLKQ, CLKIB and CLKQB and may generate first through fourth adjusted clock signals ACLKI, ACLKQ, ACLKIB and ACLKQB by adjusting delays of (or delaying) the second through fourth clock signals CLKQ, CLKIB and CLKQB based on the first clock signal CLKI, a first control code set DCC1, a second control code set DCC2, and a third control code set DCC3.

The delay circuit 410 may include a first delay line (DL1) 410a, a second delay line (DL2) 410b, a third delay line (DL3) 410c and a fourth delay line (DL4) 410d.

The first delay line 410a may output the first adjusted clock signal ACLKI by delaying the first clock signal CLKI by a fixed delay amount. The second delay line 410b may output the second adjusted clock signal ACLKQ by delaying the second clock signal CLKQ based on the first control code set DCC1. The third delay line 410c may output the third adjusted clock signal ACLKIB by delaying the third clock signal CLKIB based on the second control code set DCC2. The fourth delay line 410d may output the fourth adjusted clock signal ACLKQB by delaying the fourth clock signal CLKQB based on the third control code set DCC3.

The clock selector 430 may select two of the first through fourth adjusted clock signals as the first corrected clock signal CCLKI and the second corrected clock signal CCLKQ based on a fourth selection signal SS4, and may provide the first corrected clock signal CCLKI and the second corrected clock signal CCLKQ to the clock generation circuit 600 in FIG. 2. The selected two of the first through fourth adjusted clock signals may have a phase difference of 90 degree.

The first multiplexer 470a may receive the first through fourth adjusted clock signals ACLKI, ACLKQ, ACLKIB and ACLKQB and may select a first one of the first through fourth adjusted clock signals ACLKI, ACLKQ, ACLKIB and ACLKQB as a first selected clock signal SCLK1 based on a first selection signal SS1. The second multiplexer 470b may receive the first through fourth adjusted clock signals ACLKI, ACLKQ, ACLKIB and ACLKQB and may select a second one of the first through fourth adjusted clock signals ACLKI, ACLKQ, ACLKIB and ACLKQB as a second selected clock signal SCLK2 based on a second selection signal SS2. The second one may have a phase lead of 90 degrees with respect to the first selected clock signal SCLK1.

For example, when the first multiplexer 470a selects the second adjusted clock signal ACLKQ as the first selected clock signal SCLK1, the second multiplexer 470b may select the first adjusted clock signal ACLKI as the second selected clock signal SCLK2.

The phase interpolator 500 may generate a delayed selected clock signal SCLKD2 by delaying the second selected clock signal SCLK2 based on a fourth control code set CDCC and FDCC. The phase interpolator 500 may generate the delayed selected clock signal SCLKD2 by delaying a phase of the second selected clock signal SCLK2 by 90 degrees. The fourth control code set CDCC and FDCC may include a first sub control code set CDCC and a second sub control code set FDCC.

The phase detector 480 may detect a phase difference between the first selected clock signal SCLK1 and the delayed selected clock signal SCLKD2, and may generate an up/down signal UP/DN based on the detected phase difference and may provide the up/down signal UP/DN to the digital loop filter 490.

For example, when the first multiplexer 470a selects the second adjusted clock signal ACLKQ as the first selected clock signal SCLK1, the second multiplexer 470b may select the first adjusted clock signal ACLKI as the second selected clock signal SCLK2 and a skew and a duty error do not occur between the first corrected clock signal CCLKI and the second corrected clock signal CCLKQ, a phase of the delayed selected clock signal SCLKD2 may be the same as a phase of the second adjusted clock signal ACLKQ. When the phase of the delayed selected clock signal SCLKD2 is not the same as the phase of the second adjusted clock signal ACLKQ, at least one of the skew and the duty error occurs between the first corrected clock signal CCLKI and the second corrected clock signal CCLKQ.

The phase detector 480, in the second operation mode, may generate a relock signal RLK3 based on a phase difference between the first selected clock signal SCLK1 and the delayed selected clock signal SCLKD2 and may apply the relock signal RLK3 to the delay control circuit 491.

The digital loop filter 490 may filter the up/down signal UP/DN and in response to a third selection signal SS3, may provide the filtered up/down signal to the fourth delay controller 496 and one of the first through third delay controllers 493, 494 and 495, which is associated with the first selected clock signal SCLK1. In this case, the associated one is the first delay controller 493.

The first delay controller 493 may adjust code values of the first control code set DCC1 based on the up/down signal UP/DN to provide the first control code set DCC1 to the second delay line 410b. The second delay line 410b may generate the second adjusted clock signal ACLKQ by adjusting the delay of the second clock signal CLKQ based on the first control code set DCC1.

The first multiplexer 470a selects the first adjusted clock signal ACLKI as the first selected clock signal SCLK1 in response to the first selection signal SS1, the second multiplexer 470b selects the fourth adjusted clock signal ACLKQB as the second selected clock signal SCLK2, the third delay controller 495 may adjust code values of the third control code set DCC3 based on the up/down signal UP/DN to provide the third control code set DCC3 to the fourth delay line 410d.

While these processes are repeated, the delay circuit 410 may output the first through fourth adjusted clock signals ACLKI, ACLKQ, ACLKIB and ACLKQB by adjusting delays of the second through fourth clock signals CLKQ, CLKIB and CLKQB with respect to the first clock signal CLKI.

The delay control circuit 491 may adjust code values of the first through fourth control codes DCC1, DCC2, DCC3 and CDCC and FDCC in response to the relock signal RLK in the second operation mode and may provide the first through fourth control codes DCC1, DCC2, DCC3 and CDCC and FDCC to the delay circuit 410 and the phase interpolator 500.

In example embodiments, a binary to thermometer (i.e., unary) code converter may be disposed between the delay control circuit 491 and the duty cycle adjusting circuit 410. The binary to thermometer code converter may convert the first through third control code sets DCC1, DCC2 and DCC3 to thermometer codes to provide the thermometer codes to the delay circuit 410.

The first selection signal SS1, the second selection signal SS2, the third selection signal SS3 and the fourth selection signal SS4 may be included in the second control signal CTL2 in FIG. 2.

Figure 8A:
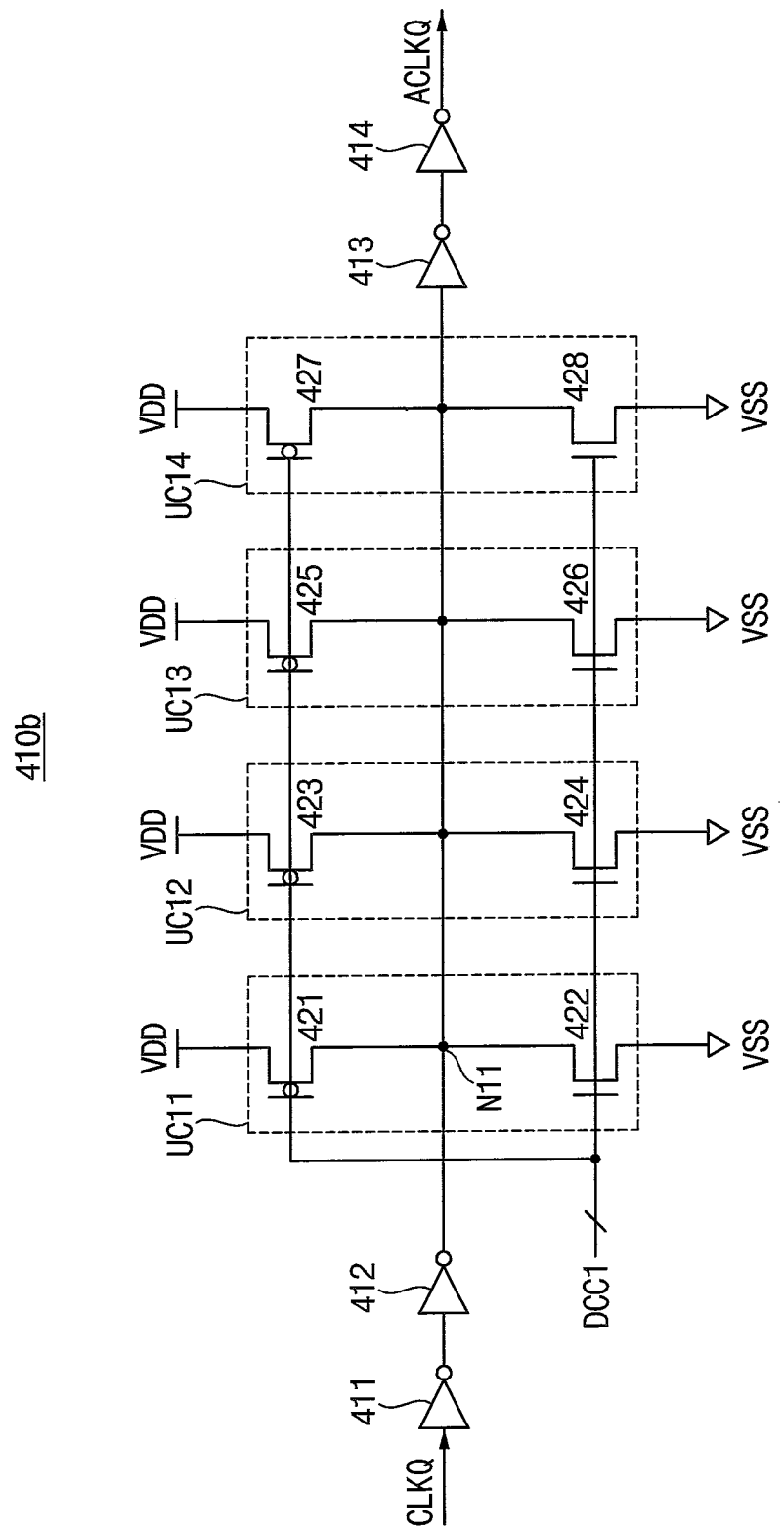
FIG. 8A is a circuit diagram illustrating an example of the second delay line in the quadrature error correction circuit of FIG. 7 according to example embodiments.

FIG. 8A is a circuit diagram illustrating an example of the second delay line 410b in the quadrature error correction circuit 400 of FIG. 7 according to example embodiments.

Referring to FIG. 8A, the second delay line 410b may include a plurality of inverters 411, 412, 413 and 414 and a plurality of unit cells UC11, UC12, UC13 and UC14.

The plurality of inverters 411, 412, 413 and 414 are cascaded-connected, and invert the second clock signal CLKQ four times to output the second adjusted clock signal ACLKQ.

The plurality of unit cells UC11, UC12, UC13 and UC14 are cascaded-connected between the inverters 412 and 413, and may adjust a delay amount of an output of the inverter 412. The unit cell UC11 may include a p-channel metal-oxide semiconductor (PMOS) transistor 421 connected between a power supply voltage VDD and a node N11 and a n-channel metal-oxide semiconductor (NMOS) transistor 422 connected between the node N11 and a ground voltage VSS. The unit cell UC12 may include a PMOS transistor 423 connected between the power supply voltage VDD and the node N11 and an NMOS transistor 424 connected between the node N11 and the ground voltage VSS. The unit cell UC13 may include a PMOS transistor 425 connected between the power supply voltage VDD and the node N11 and an NMOS transistor 426 connected between the node N11 and the ground voltage VSS. The unit cell UC14 may include a PMOS transistor 427 connected between the power supply voltage VDD and the node N11 and an NMOS transistor 428 connected between the node N11 and the ground voltage VSS.

Each gate of the PMOS transistors 421, 423, 425 and 427 and each gate of the NMOS transistors 422, 424, 426 and 428 may receive respective one of bits of the first control code set DCC1.

Each configuration of the first delay line 410a, the third delay line 410c and the fourth delay line 410d in FIG. 7 may be similar with a configuration of the second delay line 410b in FIG. 8A.

Figure 8B:
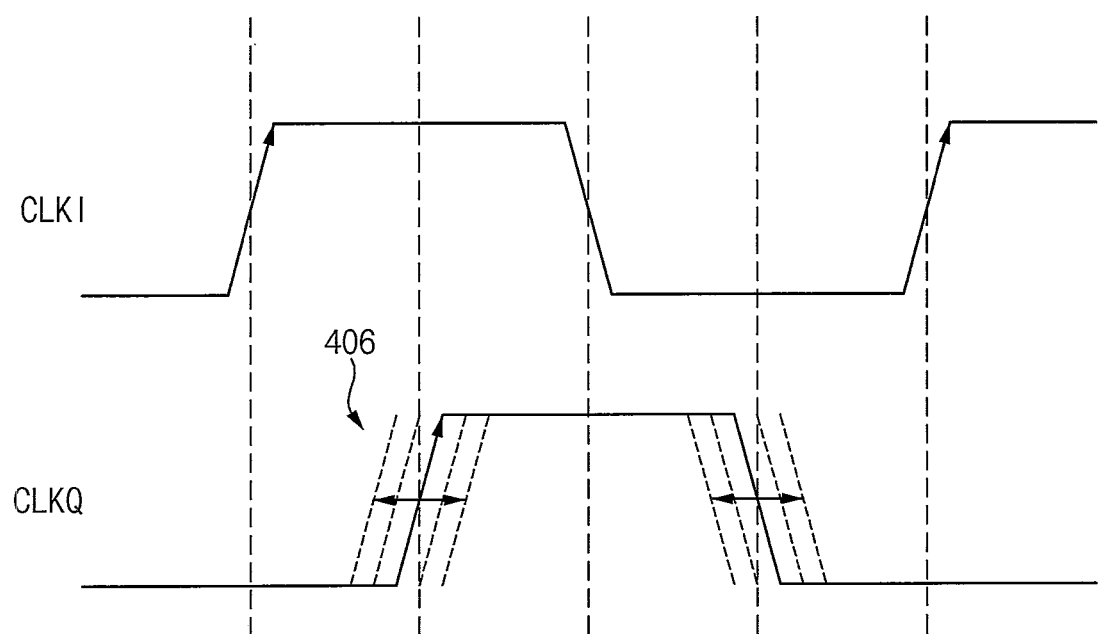
FIG. 8B illustrates an example operation of delay circuit in the quadrature error correction circuit of FIG. 7 according to example embodiments.

FIG. 8B illustrates an example operation of delay circuit 410 in the quadrature error correction circuit 400 of FIG. 7 according to example embodiments.

Referring to FIGS. 7 and 8B, the delay circuit 410 may adjust delay of the second clock signal CLKQ with respect to the first clock signal CLKI based on the first control code set DCC1 as a reference numeral 406 indicates.

Figure 9:
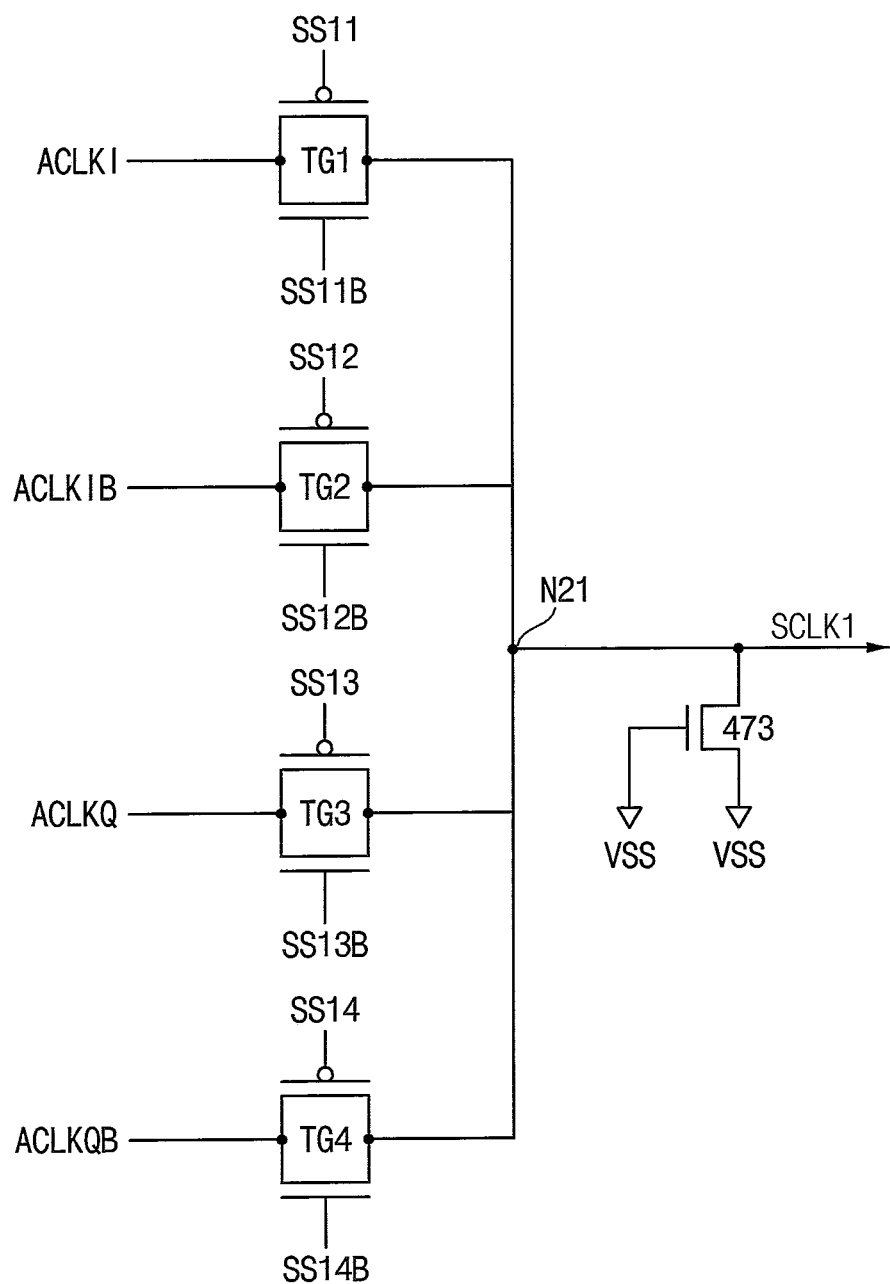
FIG. 9 is a circuit diagram illustrating an example of the first multiplexer in the quadrature error correction circuit of FIG. 7 according to example embodiments.

FIG. 9 is a circuit diagram illustrating an example of the first multiplexer 470a in the quadrature error correction circuit 400 of FIG. 7 according to example embodiments.

Referring to FIG. 9, the first multiplexer 470a may include first through fourth transmission gates TG1, TG2, TG3 and TG4 and an NMOS transistor 473. The first through fourth transmission gates TG1, TG2, TG3 and TG4 may be connected to a node N21 in parallel with respect to each other, may receive the first adjusted clock signal ACLKI, the third adjusted clock signal ACLKIB, the second adjusted clock signal ACLKQ and the fourth adjusted clock signal ACLKQB respectively, and may be selectively turned-on in response to selection bits SS11 and SS11b, SS12 and SS12b, SS13 and SS13B and SS14 and SS14B of the first selection signal SS1 respectively to provide one of the first adjusted clock signal ACLKI, the third adjusted clock signal ACLKIB, the second adjusted clock signal ACLKQ and the fourth adjusted clock signal ACLKQB as the first selected clock signal SCLK1. The NMOS transistor 473 may be connected between the node N21 and the ground voltage VSS and may have a gate coupled to the ground voltage VSS.

A configuration of the second multiplexer 470b in FIG. 7 may be substantially the same as a configuration of the first multiplexer 470a of FIG. 9.

Figure 10:
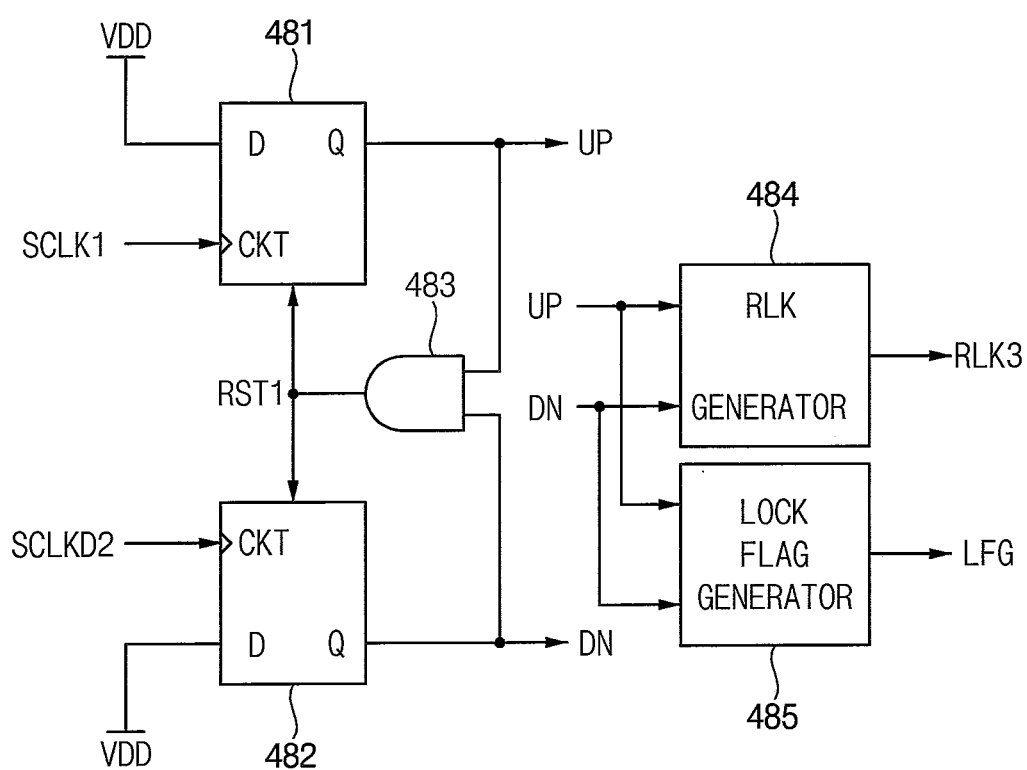
FIG. 10 is a circuit diagram illustrating an example of the phase detector in the quadrature error correction circuit of FIG. 7 according to example embodiments.

FIG. 10 is a circuit diagram illustrating an example of the phase detector 480 in the quadrature error correction circuit 400 of FIG. 7 according to example embodiments.

Referring to FIG. 10, the phase detector 480 may include a first flip-flop 481, a second flip-flop 482, an AND gate 483, a relock signal (RLK) generator 484 and a lock flag generator 485.

The first flip-flop 481 may be synchronized with the first selected clock signal SCLK1. Similarly, the second flip-flop 482 may be synchronized with the delayed selected clock signal SCLKD2. A data input D of each of the first and second flip-flops 481 and 482 may be connected to the power supply voltage VDD. That is, the data input D may be connected to a logic "1". The first flip-flop 481 may output an output Q as logic "1" at a rising edge of the first selected clock signal SCLK1. Similarly, the second flip-flop 482 may output an output Q as logic "1" at a rising edge of the delayed selected clock signal SCLKD2. The output Q of the first flip-flop 481 may become a first up signal UP and the output Q of the second flip-flop 482 may become a first down signal DN.

The AND gate 483 performs an AND operation on the output Q of the first flip-flop 481 and the output Q of the second flip-flop 482 and may output a reset signal RST. The reset signal RST may be provided to the first and second flip-flops 481 and 482.

When a phase of the first selected clock signal SCLK1 is earlier than a phase of the delayed selected clock signal SCLKD2, the first up signal UP may become logic "1" from the rising edge of the first selected clock signal SCLK1 and may become logic "0" from the rising edge of the delayed selected clock signal SCLKD2. Similarly, when a phase of the delayed selected clock signal SCLKD2 is earlier than a phase of the first selected clock signal SCLK1, the first down signal DN may become logic "1" from the rising edge of the delayed selected clock signal SCLKD2 and may become logic "0" from the rising edge of the first selected clock signal SCLK1.

The relock signal generator 484 may provide the delay control circuit 481 with the relock signal RLK3 based on the up/down signal UP/DN when a phase difference between the first selected clock signal SCLK1 and the delayed selected clock signal SCLKD2 is equal to or greater than a reference value.

The lock flag generator 485, based on the up/down signal UP/DN may generate a lock flag LFG with a low level in response to the phase difference between the first selected clock signal SCLK1 and the delayed selected clock signal SCLKD2 being equal to or greater than the reference value, and generate the lock flag LFG with a low level in response to the phase difference between the first selected clock signal SCLK1 and the delayed selected clock signal SCLKD2 being smaller than the reference value.

Figure 11:
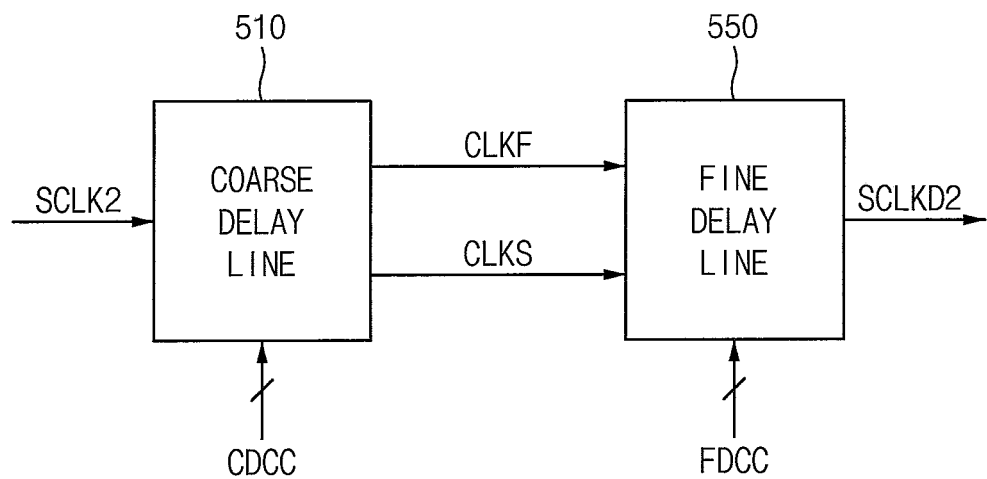
FIG. 11 is a block diagram illustrating an example of the phase interpolator in the quadrature error correction circuit of FIG. 7 according to example embodiments.

FIG. 11 is a block diagram illustrating an example of the phase interpolator 500 in the quadrature error correction circuit 400 of FIG. 7 according to example embodiments.

Referring to FIG. 11, the phase interpolator 500 may include a coarse delay line 510 and a fine delay line 550.

Hereinafter, the coarse delay line 510 will be referred to as a first delay circuit and the fine delay line 550 will be referred to as a second delay circuit.

The first delay circuit 510 may delay the second selected clock signal SCLK2 based on a first sub control code set CDCC to generate a first delayed clock signal CLKF and a second delayed clock signal CLKS. The second delay circuit 550 may interpolate phases of the first delayed clock CLKF signal and the second delayed clock signal CLKS based on a second sub control code set FDCC to generate the delayed selected clock signal SCLKD2. A phase of the delayed selected clock signal SCLKD2 may be delayed by 90 degrees with respect to the second selected clock signal SCLK2.

Figure 12:
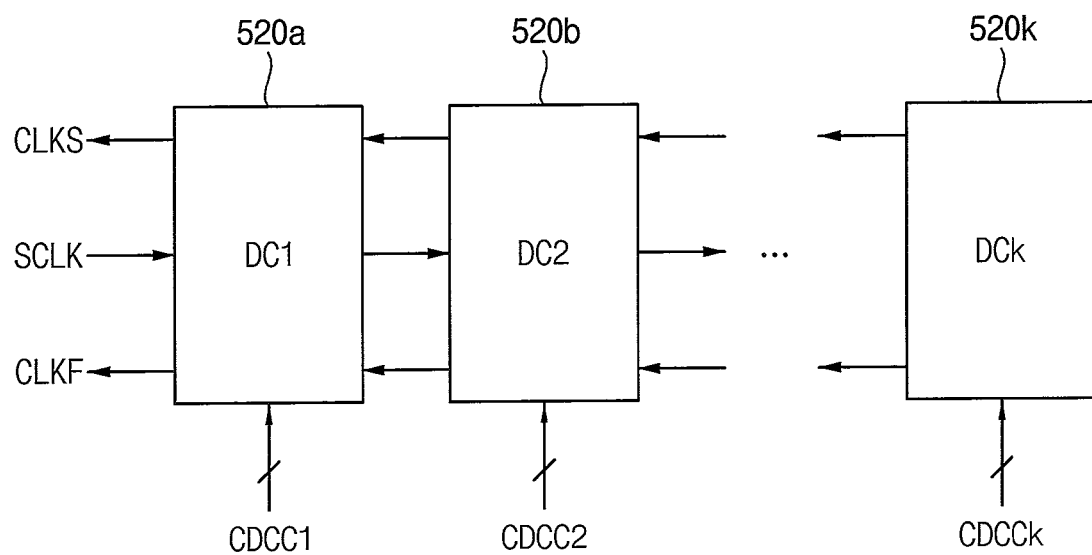
FIG. 12 is a block diagram illustrating an example of the first delay circuit in the phase interpolator of FIG. 11 according to example embodiments.

FIG. 12 is a block diagram illustrating an example of the first delay circuit 510 in the phase interpolator 500 of FIG. 11 according to example embodiments.

Referring to FIG. 12, the first delay circuit 510 may include a plurality of cascade-connected delay cells (DC1, DC2, . . . , DCk) 520a, 520b, . . . , 520k (k is a natural number equal to or greater than three). The plurality of cascade-connected delay cells 520a, 520b, . . . , 520k may be referred to as first through k-th delay cells.

The plurality of delay cells 520a, 520b, . . . , 520k may delay the second selected clock signal SCLK2 based on the first sub control code set to output the first delayed clock signal CLKF and the second delayed clock signal CLKS having a fixed delay amount.

The first delay cell 520a may receive a first control code CDCC1. The second delay cell 520b may receive a second control code CDCC2. The k-th delay cell 520k may receive a k-th control code CDCCk.

Figure 13:
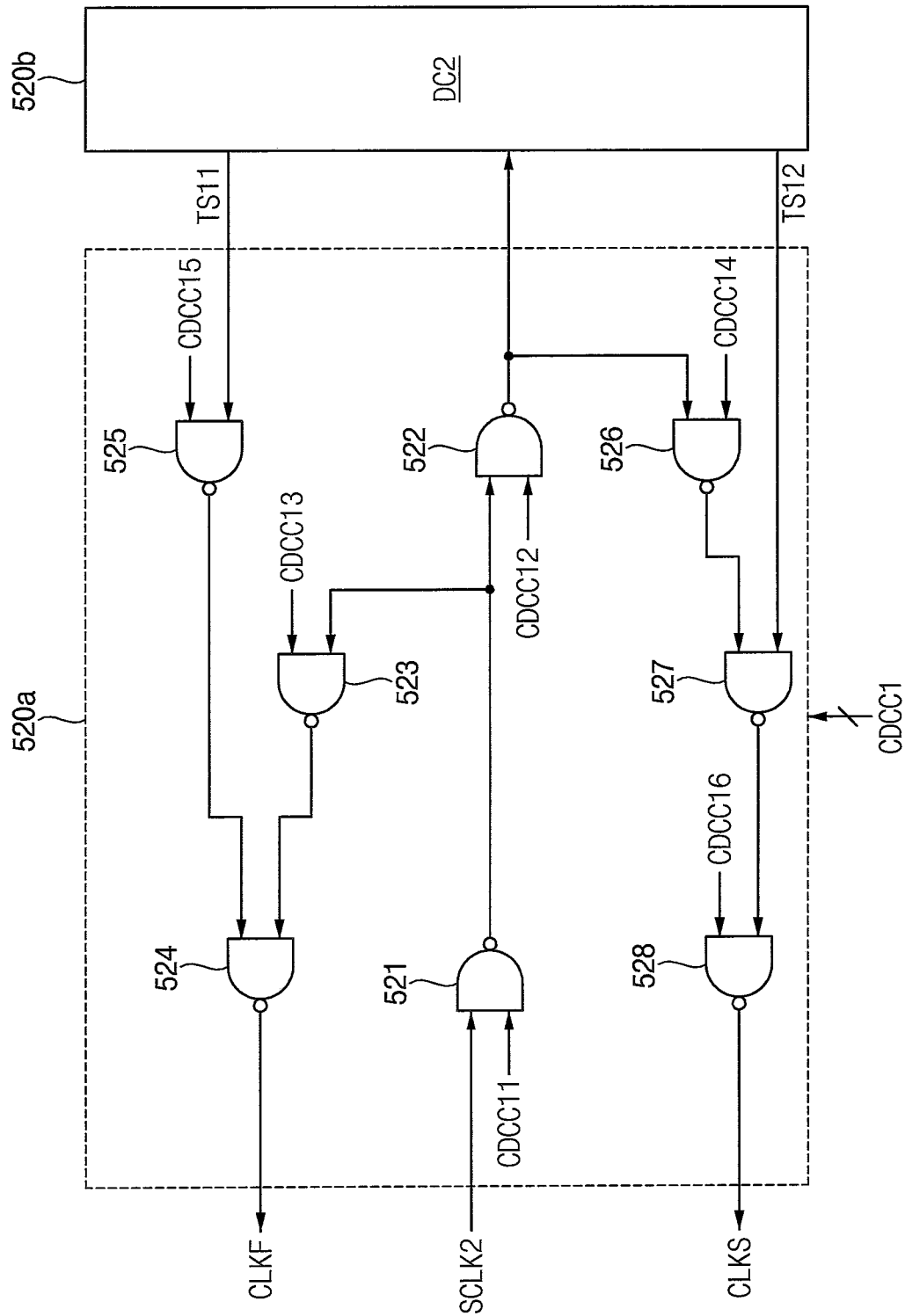
FIG. 13 is a circuit diagram illustrating an example of the first delay cell of the plurality of delay cells in FIG. 12 according to example embodiments.

FIG. 13 is a circuit diagram illustrating an example of the first delay cell 520a of the plurality of delay cells in FIG. 12 according to example embodiments.

Each of the delay cells 520b, . . . , 520k may have the same configuration as a configuration of the first delay cell 520a. That is, the plurality of delay cells 520a, 520b, . . . , 520k may have the same configuration with respect to one another.

Referring to FIG. 13, the first delay cell 520a may include a plurality of NAND gates 521~528.

The NAND gate 521 performs a NAND operation on the second selected clock signal SCLK2 and a first control bit CDCC11. The NAND gate 522 performs a NAND operation on an output of the NAND gate 521 and second control bit CDCC12. The NAND gate 523 performs a NAND operation on the output of the NAND gate 521 and a third control bit CDCC13. The NAND gate 525 performs a NAND operation on a transfer signal TS11 from the second delay cell 520b and a fifth control bit CDCC15. The NAND gate 524 performs a NAND operation on the output of the NAND gate 523 and an output of the NAND gate 525 to output the first delayed clock signal CLKF.

The NAND gate 526 performs a NAND operation on the output of the NAND gate 522 and a fourth control bit CDCC14. The NAND gate 527 performs a NAND operation on a transfer signal TS12 from the second delay cell 520b and the output of the NAND gate 526. The NAND gate 528 performs a NAND operation on the output of the NAND gate 527 and a sixth control bit CDCC16 to output the second delayed clock signal CLKS.

The second through fifth control bits CDCC12, CDCC13, CDCC14 and CDCC15 may determine delay amounts of the first delayed clock signal CLKF and the second delayed clock signal CLKS. The second delayed clock signal CLKS may be delayed by a delay amount corresponding to two NAND gates with respect to the first delayed clock signal CLKF.

Figure 14:
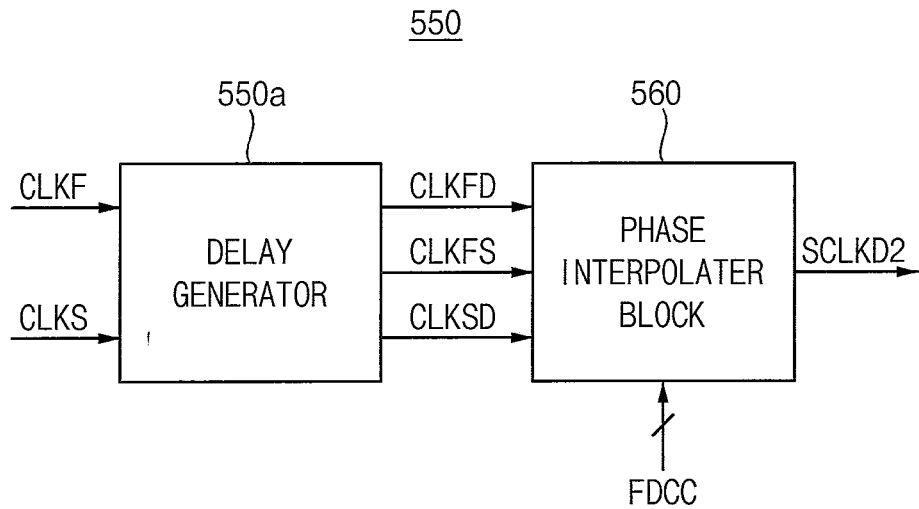
FIG. 14 is a block diagram illustrating an example of the second delay circuit in the phase interpolator of FIG. 11 according to example embodiments.

FIG. 14 is a block diagram illustrating an example of the second delay circuit 550 in the phase interpolator 500 of FIG. 11 according to example embodiments.

Referring to FIG. 14, the second delay circuit 550 may include a delayed clock signal generator 550a and a phase interpolator block 560.

The delayed clock signal generator 550a may delay the first delayed clock signal CLKF and the second delayed clock signal CLKS to generate first through third sub delayed clock signals CLKFD, CLKFS and CLKSD. The phase interpolator block 560 may finely adjust delay amounts of the first through third sub delayed clock signals CLKFD, CLKFS and CLKSD based on the second control code set FDCC to output the first delayed output clock signal CLKD1. The phase interpolator block 560 may divide each phase of the first through third sub delayed clock signals CLKFD, CLKFS and CLKSD, and may interpolate the divided phases to output the delayed selected clock signal SCLKD2, in response to the second sub control code set FDCC.

Figure 15:
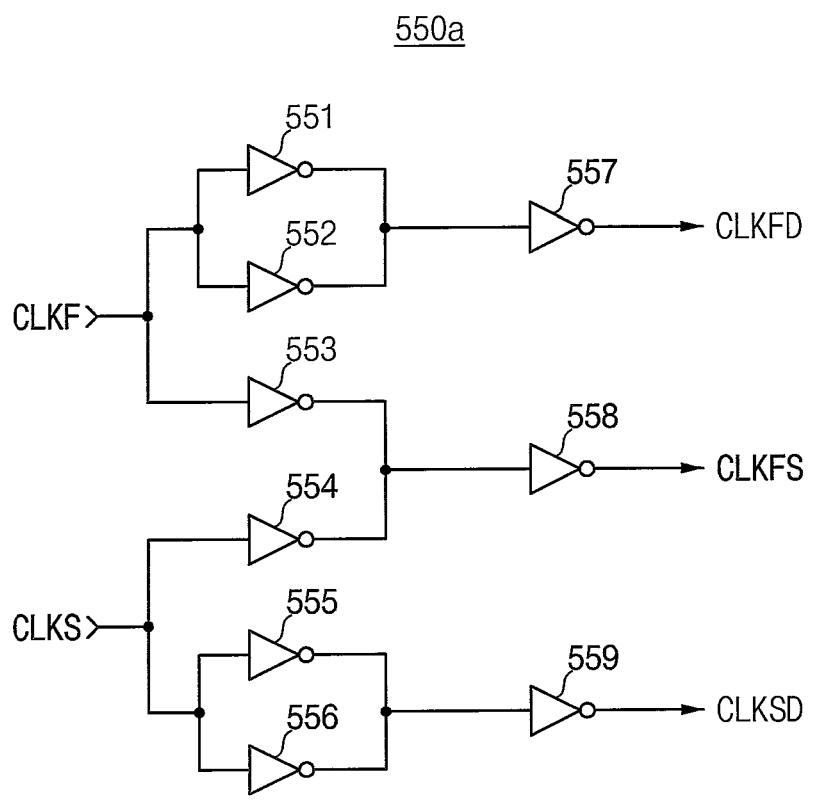
FIG. 15 is a block diagram illustrating an example of the delayed clock signal generator in the second delay circuit of FIG. 14 according to example embodiments.

FIG. 15 is a block diagram illustrating an example of the delayed clock signal generator 550a in the second delay circuit 550 of FIG. 14 according to example embodiments.

Referring to FIG. 15, the delayed clock signal generator 550a may include a plurality of inverters 551~559.

Each of the inverters 551, 552 and 553 inverts the first delayed clock signal CLKF. Each of the inverters 554, 555 and 556 inverts the second delayed clock signal CLKS. The inverter 557 inverts outputs of the 551 and 552 to output the first sub delayed clock signal CLKFD. The inverter 558 inverts outputs of the 553 and 554 to output the second sub delayed clock signal CLKFS. The inverter 559 inverts outputs of the 555 and 556 to output the third sub delayed clock signal CLKSD.

Therefore, the first sub delayed clock signal CLKFD is delayed by a delay amount of two inverters with respect to the first delayed clock signal CLKF, the second sub delayed clock signal CLKFS is delayed by a delay amount correspond to sum of a delay amount of two inverters and a delay amount between the first delayed clock signal CLKK and the second delayed clock signal CLKS with respect to the first delayed clock signal CLKF, and the third sub delayed clock signal CLKDD is delayed by a delay amount of two inverters with respect to the second delayed clock signal CLKS.

Figure 16:
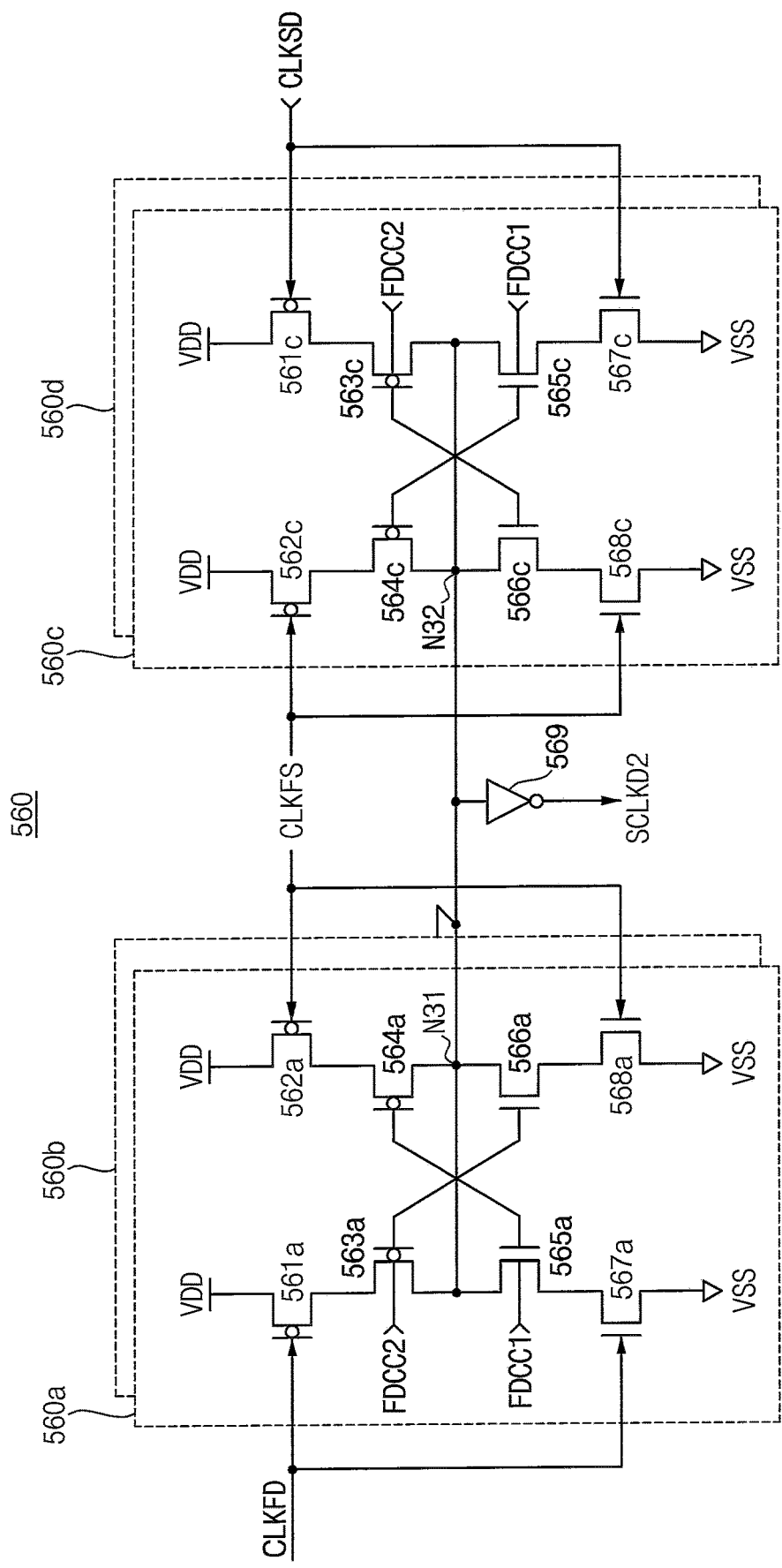
FIG. 16 is a block diagram illustrating an example of the phase interpolator block in the second delay circuit of FIG. 14 according to example embodiments.

FIG. 16 is a block diagram illustrating an example of the phase interpolator block 560 in the second delay circuit 550 of FIG. 14 according to example embodiments.

Referring to FIG. 16, the phase interpolator block 560 may include a plurality of phase interpolators 560a, 560b, 560c and 560d and an inverter 569.

The phase interpolator 560a may include PMOS transistors 561a~564a and NMOS transistors 565a~568a. The PMOS transistors 561a and 563a and the NMOS transistors 565a and 567a are cascade-connected between the power supply voltage VDD and the ground voltage VSS, and the PMOS transistors 562a and 564a and the NMOS transistors 566a and 568a are cascade-connected between the power supply voltage VDD and the ground voltage VSS.

Gates of the PMOS transistor 561a and the NMOS transistor 567a receive the first sub delayed clock signal CLKFD, gates of the PMOS transistor 562a and the NMOS transistor 568a receive the second sub delayed clock signal CLKFS, gates of the PMOS transistor 563a and the NMOS transistor 566a receive a second control bit FDCC2 of the second sub control code set FDCC and gates of the PMOS transistor 564a and the NMOS transistor 565a receive a first control bit FDCC1 of the second sub control code set FDCC. The PMOS transistor 564a and the NMOS transistor 566a may be connected to each other at a node N31.

A configuration of the phase interpolator 560b may be the same as a configuration of the phase interpolator 560a.

The phase interpolator 560c may include PMOS transistors 561c~564c and NMOS transistors 565c~568c. The PMOS transistors 561c and 563c and the NMOS transistors 565c and 567c are cascade-connected between the power supply voltage VDD and the ground voltage VSS, and the PMOS transistors 562c and 564c and the NMOS transistors 566c and 568c are cascade-connected between the power supply voltage VDD and the ground voltage VSS.

Gates of the PMOS transistor 561c and the NMOS transistor 567c receive the third sub delayed clock signal CLKSD, gates of the PMOS transistor 562c and the NMOS transistor 568c receive the second sub delayed clock signal CLKFS, gates of the PMOS transistor 563c and the NMOS transistor 566c receive the second control bit FDCC2 of the second sub control code set FDCC and gates of the PMOS transistor 564c and the NMOS transistor 565c receive the first control bit FDCC1 of the second sub control code set FDCC. The PMOS transistor 564c and the NMOS transistor 566c may be connected to each other at a node N32.

A configuration of the phase interpolator 560d may be the same as a configuration of the phase interpolator 560c.

The node N31 and the node N32 are coupled to each other, and the inverter 569 averages voltage levels of the node N31 and the node N32 to output the delayed selected clock signal SCLKD2.

Figure 17:
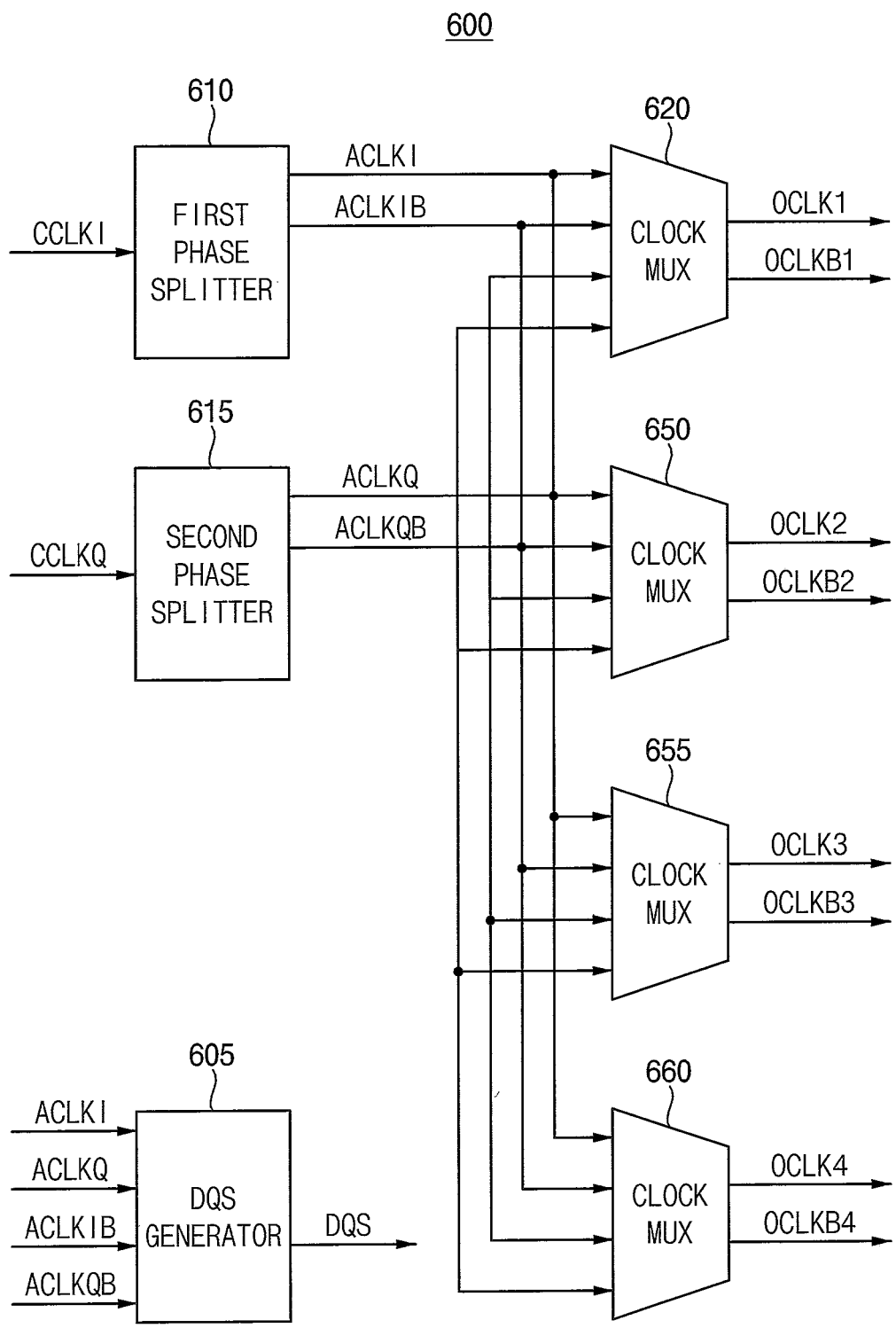
FIG. 17 is a block diagram illustrating an example of the clock generation circuit in the semiconductor memory device of FIG. 2 according to example embodiments.

FIG. 17 is a block diagram illustrating an example of the clock generation circuit 600 in the semiconductor memory device 200 of FIG. 2 according to example embodiments.

Referring to FIG. 17, the clock generation circuit 600 may include a first phase splitter 610, a second phase splitter 615, a strobe signal (DQS) generator 605 and first through fourth clock multiplexers 620, 650, 655 and 660.

The first phase splitter 610 may split a phase of the first corrected clock signal CCLKI to output a first adjusted clock signal ACLKI and a third adjusted clock signal ACLKIB having a phase difference of 180 degrees with respect to each other. The second phase splitter 615 may split a phase of the second corrected clock signal CCLKQ to output a second adjusted clock signal ACLKQ and a fourth adjusted clock signal ACLKQB having a phase difference of 180 degrees with respect to each other. The strobe signal generator 605 may generate the strobe signal DQS based on the first through fourth adjusted clock signals ACLKI, ACLKQ, ACLKIB and ACLKQB.

Each of the first through fourth clock multiplexers 620, 650, 655 and 660 may receive the first through fourth adjusted clock signals ACLKI, ACLKQ, ACLKIB and ACLKQB and may generate the first through fourth output clock signal pairs OCLK1 and OCLKB1, OCLK2 and OCLKB2, OCLK3 and OCLKB3 and OCLK4 and OCLKB4 by combining the first through fourth adjusted clock signals ACLKI, ACLKQ, ACLKIB and ACLKQB.

Figure 18:
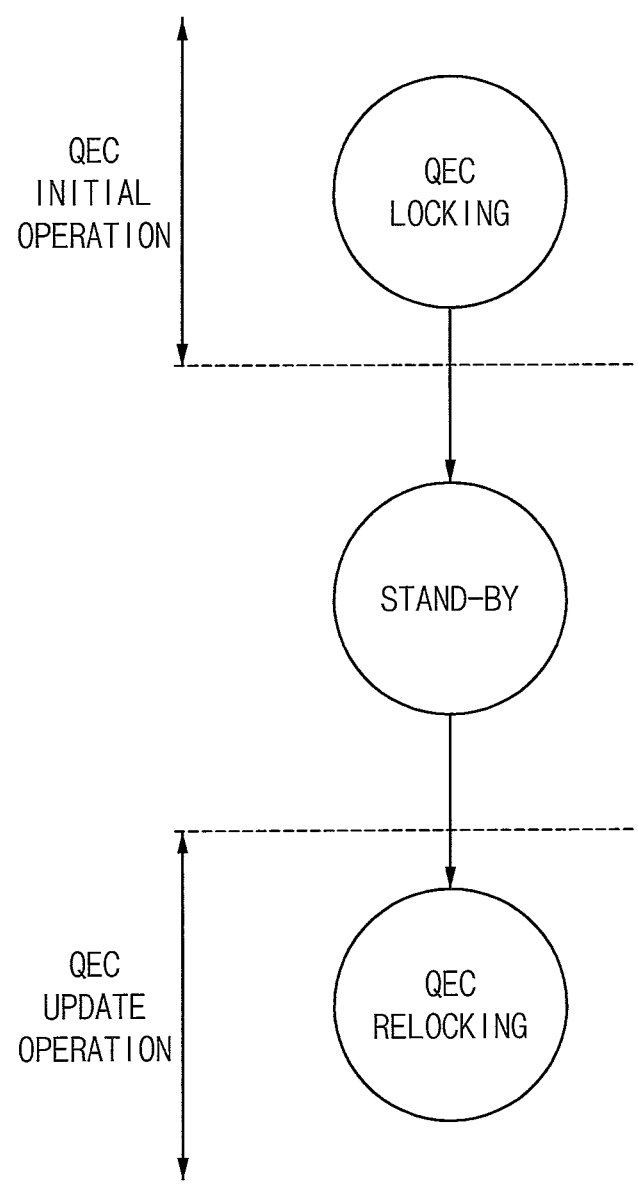
FIG. 18 illustrates operation states of the quadrature error correction according to example embodiments.

FIG. 18 illustrates operation states of the quadrature error correction circuit 400 according to example embodiments.

Referring to FIGS. 7 and 18, in a first operation mode corresponding to the initialization operation, the quadrature error correction circuit 400 may perform the locking operation QEC LOCKING to store code values of the control code sets in each of the first through fourth delay controllers 493, 494, 495 and 496.

After the initialization operation is completed, the quadrature error correction circuit 400 may be in a standby state. When the access operation is performed on the semiconductor memory device 400, the quadrature error correction circuit 400 may perform relocking operation QEC RELOCKING in the second operation mode to update code values of each of the control code sets and may store the updated code values of each of the control code sets in each of the first through fourth delay controllers 493, 494, 495 and 496.

When the quadrature error correction circuit 400 performs the relocking operation, the quadrature error correction circuit 400 may perform the relocking operation based on the code values stored in the first operation mode.

Figure 19:
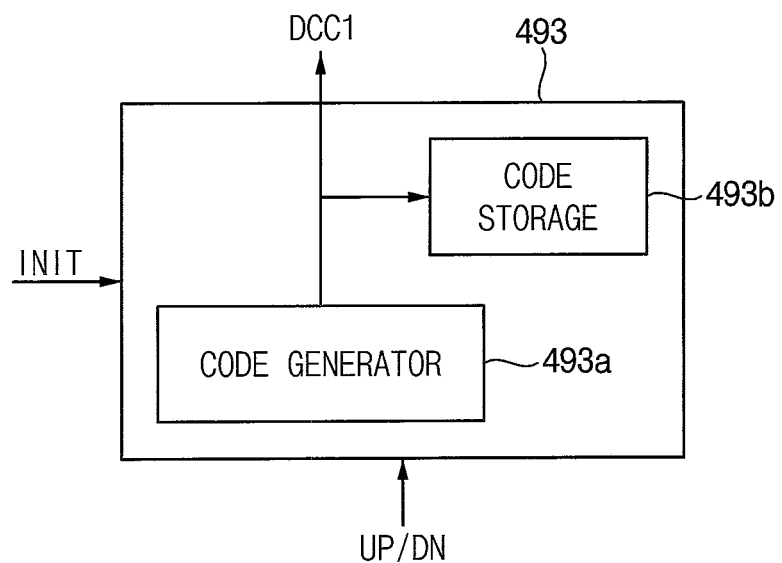
FIG. 19 is a block diagram illustrating the first delay controller in FIG. 7 according to example embodiments.

FIG. 19 is a block diagram illustrating the first delay controller 493 in FIG. 7 according to example embodiments.

Each configuration of the second, third and fourth delay controllers 494, 495 and 496 may have substantially the same configuration of the first delay controller 493 in FIG. 19.

Referring to FIG. 19, the first delay controller 493 may include a code generator 493a and a code storage 493b. The code generator 493a may start an operation of generating the first control code set DCC1 based on the up/down signal UP/DN depending on an initialization command INIT. The initialization command INIT may be a command received from the memory controller 100 for the initialization operation. The code generator 493a may store the first control code set DCC1 in the code storage 493b.

Figure 20:
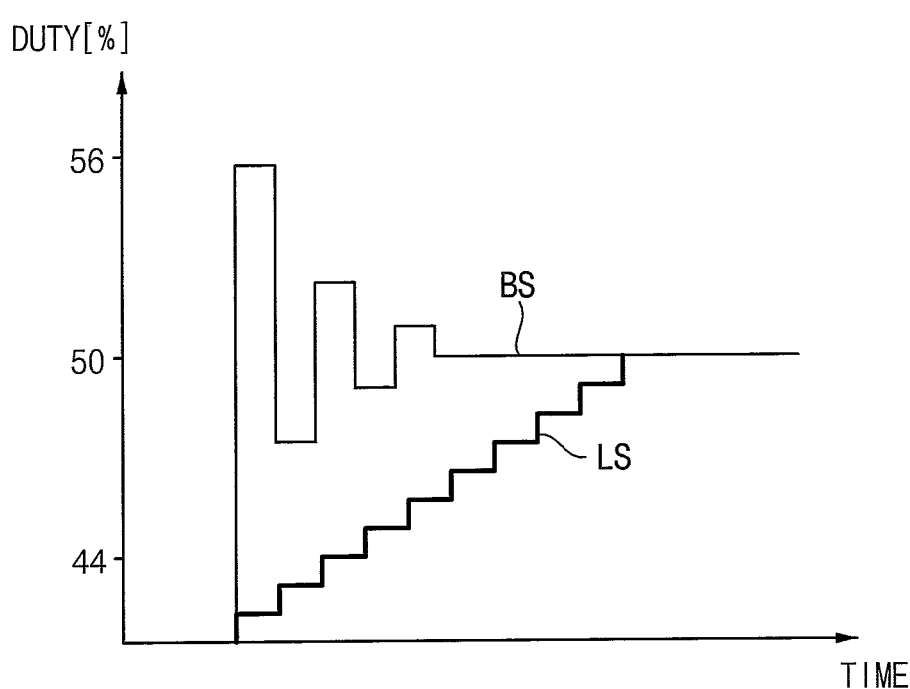
FIG. 20 illustrates that the first delay controller of FIG. 19 generates the first control code set based on a binary search or a linear search.

FIG. 20 illustrates that the first delay controller 493 of FIG. 19 generates the first control code set DCC1 based on a binary search or a linear search.

Referring to FIGS. 19 and 20, the code generator 493a may generate the first control code set DCC1 based on a binary search BS using a successive approximate register or a linear search LS and a delay amount of the second clock signal CLKQ is adjusted based on the first control code set DCC1. When the code generator 493a generates the first control code set DCC1 based on the binary search BS, the code generator 493a may select a most significant bit (MSB) from which the binary search is started.

FIG. 20 illustrates that the code generator 493a performs the binary search BS and the linear search BS and it is noted that the second clock signal CLKQ reaches a target duty of 50% faster when the code generator 493a performs the binary search BS than when the code generator 493a performs the linear search LS.

Figure 21:
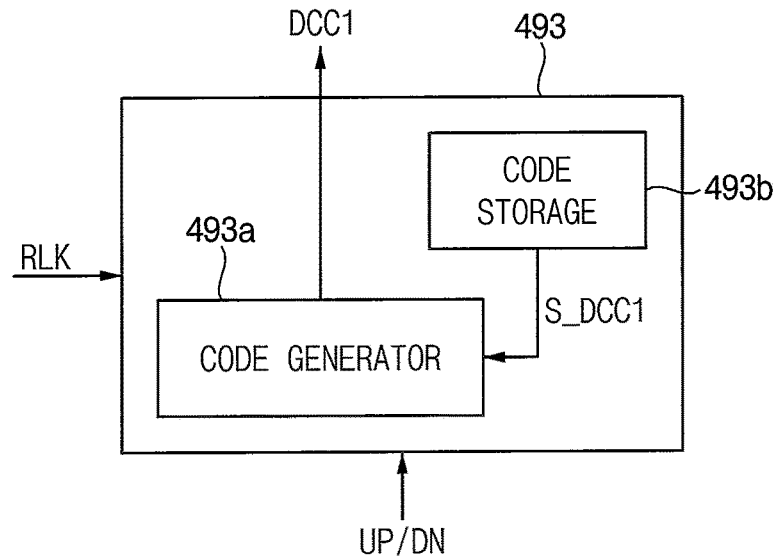
FIG. 21 illustrates the first delay controller in FIG. 7 in a second operation mode.

FIG. 21 illustrates the first delay controller 493 in FIG. 7 in a second operation mode.

Referring to FIG. 21, when the relock signal RLK is applied to the first delay controller 493, the code generator 493a may generate the first control code set DCC1 based on the up/down signal UP/DN. The code storage 493b may provide the code generator 493a with a stored control code set S_DCC1 therein in response to the relock signal RLK. The stored control code set S_DCC1 may be a control code set generated in the first operation mode.

The code generator 493a may generate the first control code set DCC1 based on the stored control code set S_DCC1 from the code storage 493b. Since the control code set S_DCC1 is a control code set generated in the locking operation, a difference between values of the first control code set DCC1 to be newly generated in the relocking operation and code values of the provided control code set S_DCC1 may not be large. Accordingly, in the case of using the provided control code set S_DCC1, the code generator 493a may quickly perform the relocking operation. In addition, since a difference between values of the first control code set DCC1 to be newly generated in the relocking operation and code values of the provided control code set S_DCC1 is not large, the code generator 493a may perform the relocking operation based on the linear search.

Figure 22:
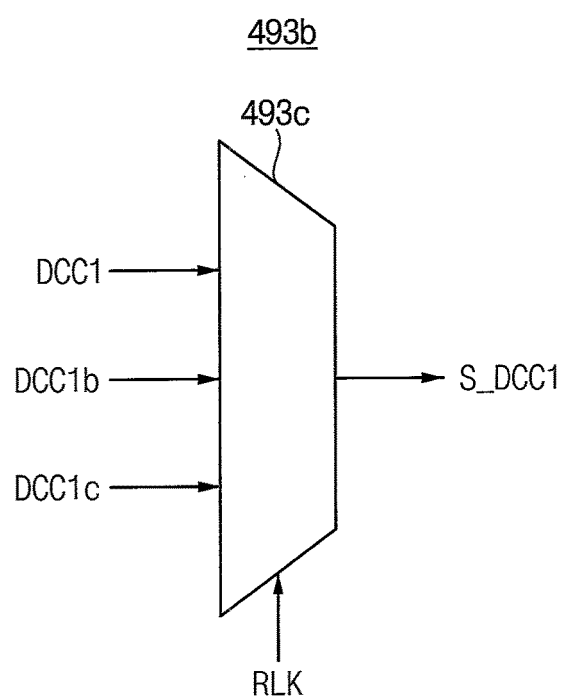
FIG. 22 illustrates an example operation of the code storage in FIG. 21.

FIG. 22 illustrates an example operation of the code storage 493b in FIG. 21.

Referring to FIGS. 21 and 22, the code storage 493b may include a multiplexer 493c. The multiplexer 439c may receive the relock signal RLK as a control input and may select one of first control code sets DCC1a, DCC1b and DCC1c and may output the selected one as the provided control code set S_DCC1 to the code generator 493a.

Figure 23A:
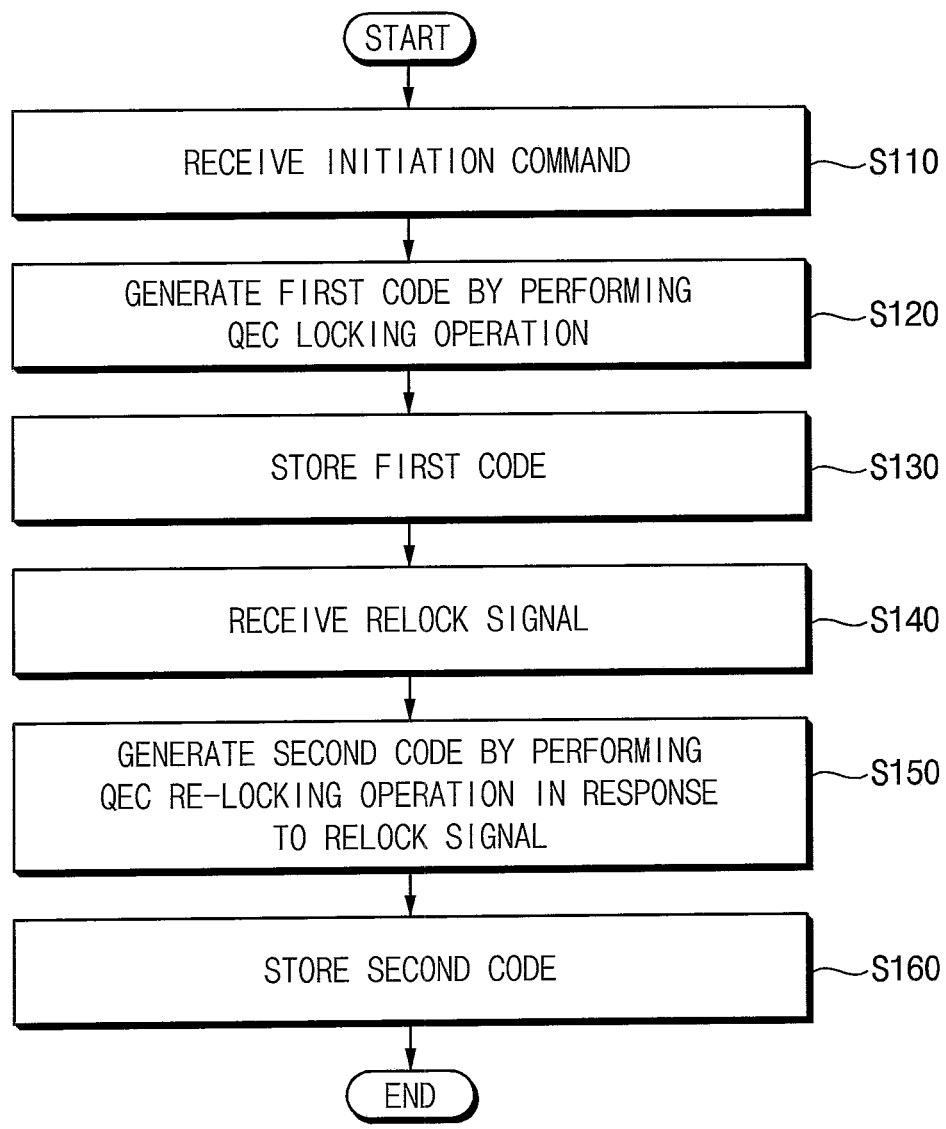
FIG. 23A is a flowchart illustrating an operation of the quadrature error correction circuit of FIG. 7 according to example embodiments.
Figure 23B:
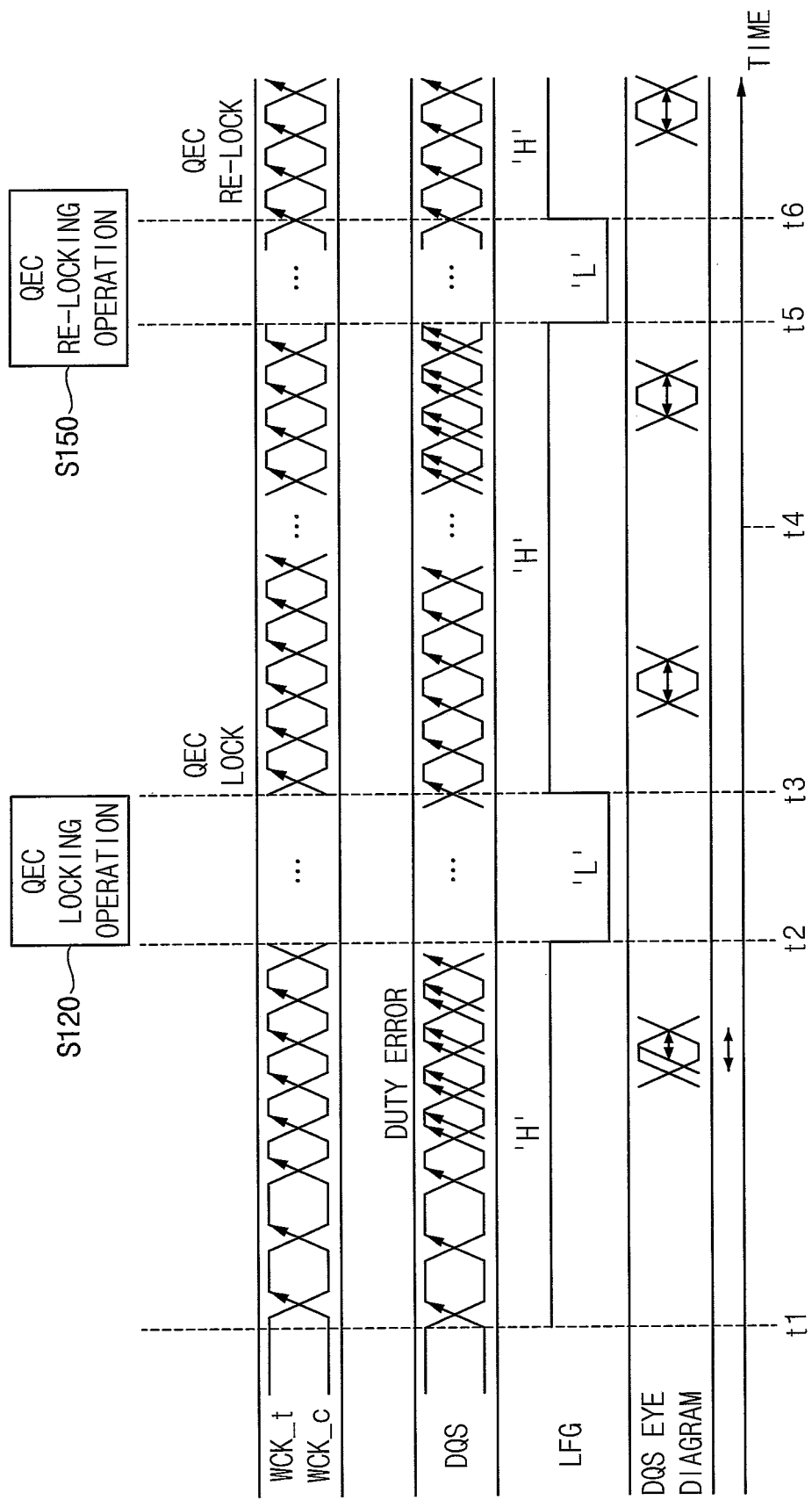
FIG. 23B is a timing diagram illustrating an operation of the quadrature error correction circuit of FIG. 7.

FIG. 23A is a flowchart illustrating an operation of the quadrature error correction circuit 400 of FIG. 7 according to example embodiments and FIG. 23B is a timing diagram illustrating an operation of the quadrature error correction circuit 400 of FIG. 7.

Referring to FIGS. 1, 2, 7, 23A and 23B, the semiconductor memory device 200 may receive an initialization command from the memory controller 100 (operation S110) at a timing point t1 and may perform an initialization operation until a timing point t2.

From the timing point t2 and to a timing point t3, the quadrature error correction circuit 400 performs the locking operation to generate first code (operation S120) and stores the first code in each of the first through fourth delay controllers 493, 494, 495 and 496 (operation S130). A duty error occurs in the data clock signal WCK and the strobe signal DQS between the timing points t1 and t2, and a duty error does not occur in the data clock signal WCK and the strobe signal DQS between timing points t3 and t4. A duty error occurs in the data clock signal WCK and the strobe signal DQS between the timing points t4 and t5 due to change of operation environment of the semiconductor memory device 200, the duty cycle monitor 680 or the duty cycle detector 110 detects a duty error and provides a relock signal RLK to the quadrature error correction circuit 400 (operation S140). During timing point t5 and t6, the quadrature error correction circuit 400 performs relocking operation in response to the relock signal RLK to generate a second code (operation S150) and stores the second code in each of the first through fourth delay controllers 493, 494, 495 and 496 (operation S160). Therefore, a duty error does not occur in the data clock signal WCK and the strobe signal DQS after timing point t6.

The first code may refer to the first through fourth control code sets in the first operation mode and the second code may refer to the first through fourth control code sets in the second operation mode.

The locking flag LFG has a low level when the quadrature error correction circuit 400 performs the locking operation and the relocking operation and the locking flag LFG has a high level when the quadrature error correction circuit 400 completes the locking operation and the relocking operation such that the second corrected clock signal CCLKQ is locked to the first corrected clock signal CCLKI.

Figure 24:
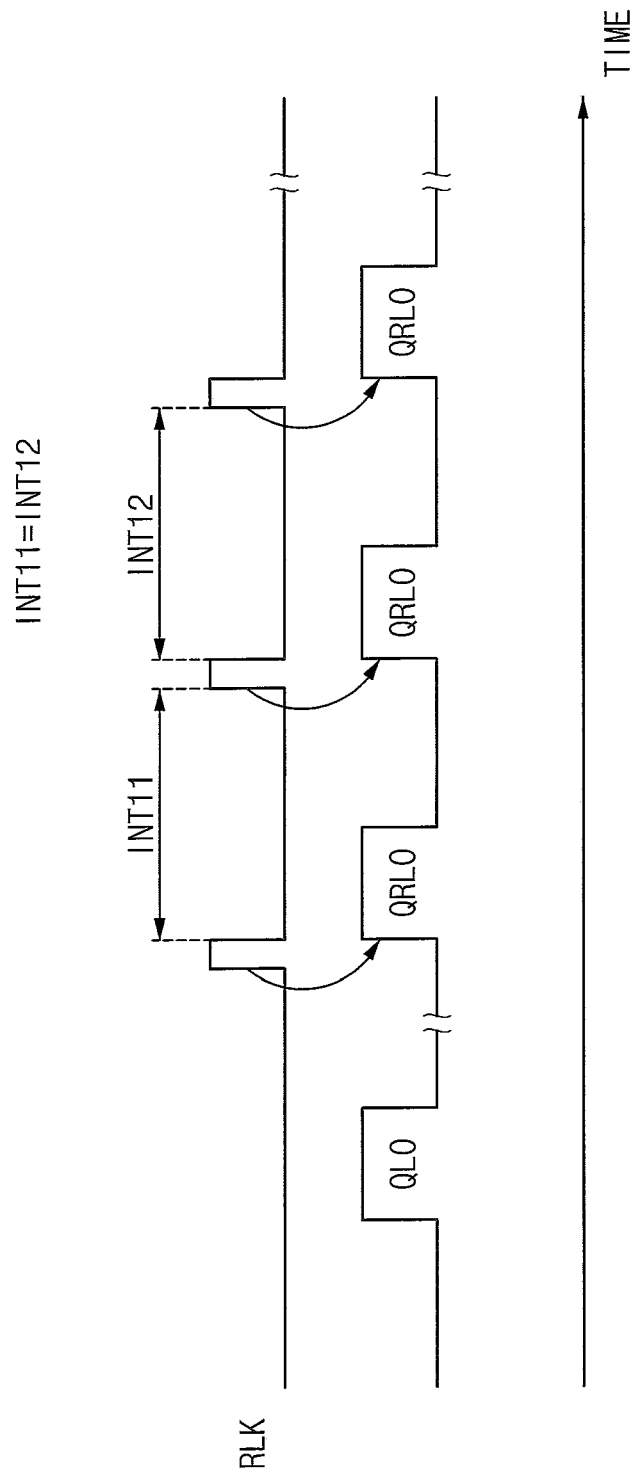
FIG. 24 illustrates the quadrature error correction circuit of FIG. 7 performing the relocking operation periodically.

FIG. 24 illustrates the quadrature error correction circuit 400 of FIG. 7 performs the relocking operation periodically.

Referring to FIG. 24, the quadrature error correction circuit 400 may perform the locking operation QLO in the first operation mode corresponding to the initialization operation, and may perform the relocking operation QRLO periodically in response to the relock signal RLK that is periodically activated in the normal mode. Intervals INT11 and INT12 between the relock signal RLK may be the same with respect to each other.

Figure 25:
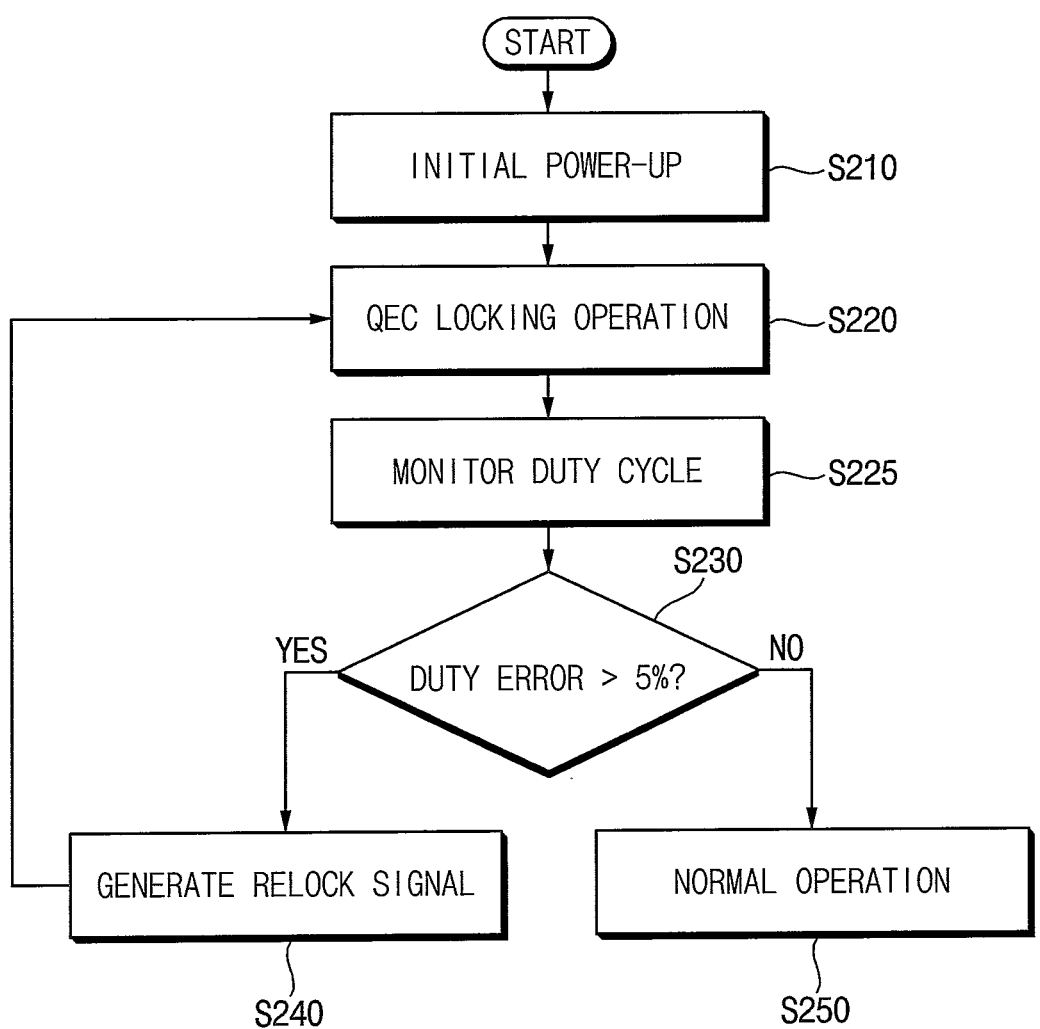
FIG. 25 is a flow chart illustrating an operation of the quadrature error correction circuit according to example embodiments.

FIG. 25 is a flow chart illustrating an operation of the quadrature error correction circuit 400 according to example embodiments.

Referring to FIGS. 1, 2, 7 and 25, the semiconductor memory device 200 may receive an initial power-up signal (operation S210). The quadrature error correction circuit 400 performs the locking operation (operation S220) to generate the first corrected clock signal CCLKI and the second corrected clock signal CCLKQ which have a phase difference of 90 degrees with respect to each other by adjusting at least one of a skew and a duty error of at least some of the first through fourth clock signals CLKI, CLKQ, CLKIB and CLKQB in a first operation mode corresponding to the initialization command. During a normal operation of the semiconductor memory device 200, the duty cycle monitor 680 monitors a duty cycle of the first corrected clock signal CCLKI and the second corrected clock signal CCLKQ (operation S225) and determines whether a duty error of the first corrected clock signal CCLKI and the second corrected clock signal CCLKQ is greater than a reference value (for example, 5%) (operation S230).

When the duty error of the first corrected clock signal CCLKI and the second corrected clock signal CCLKQ is greater than a reference value (YES in operation S230), the duty cycle monitor 680 generates the relock signal RLK (operation S240) and the quadrature error correction circuit 400 performs the relocking operation to lock the second corrected clock signal CCLKQ to the first corrected clock signal CCLKI in response to the relock signal (operation S220). When the duty error of the first corrected clock signal CCLKI and the second corrected clock signal CCLKQ is not greater than a reference value (NO in operation S230), the semiconductor memory device 200 performs a normal operation (operation S250).

Figure 26:
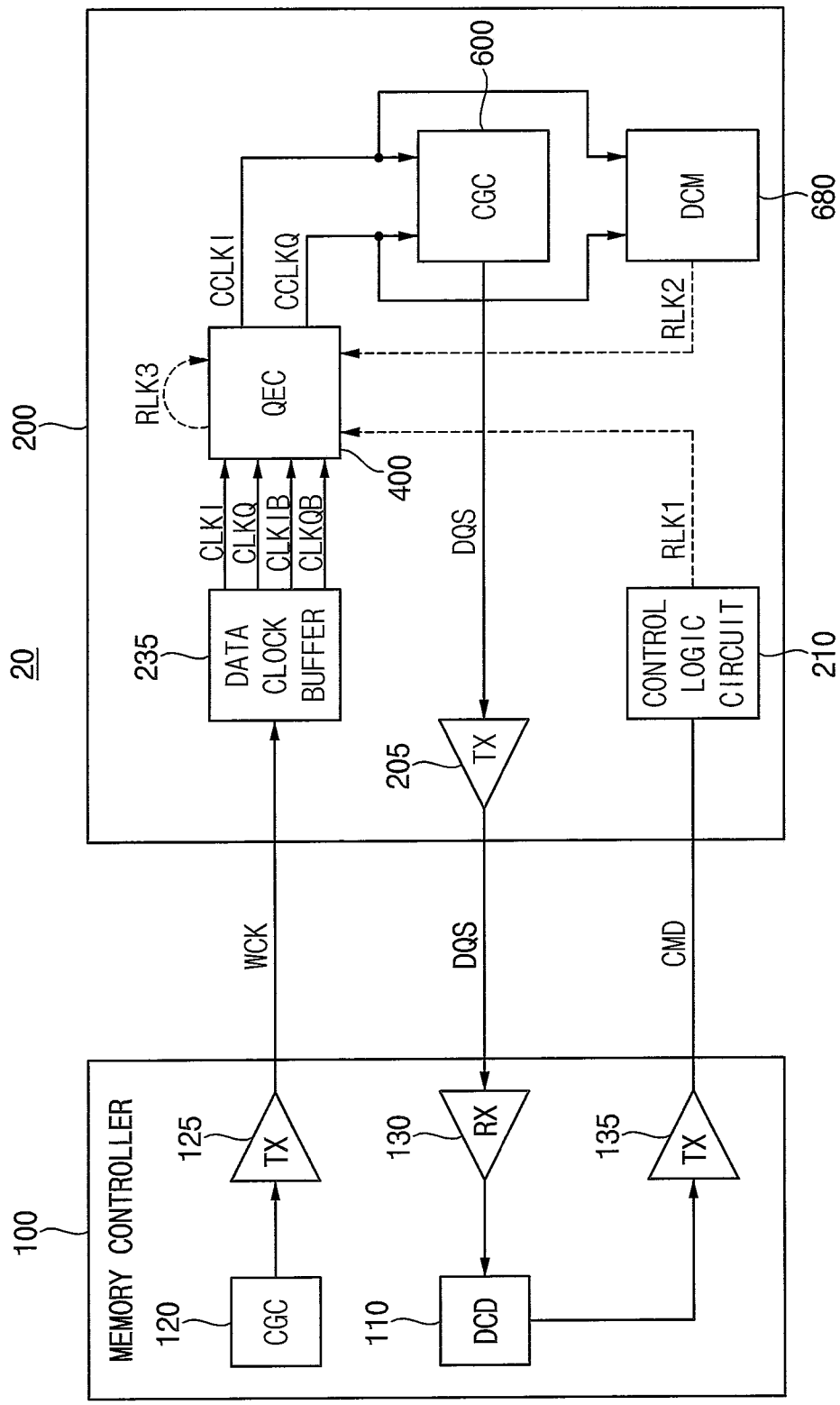
FIG. 26 is a block diagram illustrating the memory system of FIG. 1 according to example embodiments.

FIG. 26 is a block diagram illustrating the memory system 20 of FIG. 1 according to example embodiments.

FIG. 26 illustrates components associated with the locking operation and the relocking operation.

Referring to FIG. 26, the memory controller 100 may include a clock generator 120, a transmitter 125, a receiver 130, the duty cycle detector 110 and a transmitter 135.

The clock generator 120 may generate the data clock signal WCK and the transmitter 125 may transmit the data clock signal WCK to the semiconductor memory device 200. The receiver 130 may receive the strobe signal DQS from the semiconductor memory device 200. The duty cycle detector 110 may receive the strobe signal DQS from the receiver, may detect the duty cycle of the strobe signal DQS and may transmit, to the semiconductor memory device 200, the command designating the relock operation through the transmitter 135 when the duty error of the strobe signal DQS is greater than a reference value.

The semiconductor memory device 200 may include the control logic circuit 210, the data clock buffer 235, the quadrature error correction circuit 400, the clock generation circuit 600, the duty cycle monitor 680 and a transmitter 205.

The data clock buffer 235 may generate the first through fourth clock signals CLKI, CLKQ, CLKIB and CLKQB based on the data clock signal WCK, and the quadrature error correction circuit 400 may perform the locking operation to generate the first corrected clock signal CCLKI and the second corrected clock signal CCLKQ by adjusting at least one of a skew and a duty error of at least some of the first through fourth clock signals CLKI, CLKQ, CLKIB and CLKQB in a first operation mode.

The clock generation circuit 600 may generate the strobe signal DQS based on the first corrected clock signal CCLKI and the second corrected clock signal CCLKQ and may transmit the strobe signal DQS to the memory controller 100 through the transmitter 205.

The control logic circuit 210 may generate the relock signal RLK1 based on the command CMD designating the relocking operation and may provide the relock signal RLK1 to the quadrature error correction circuit 400. The duty cycle monitor 680 may monitor duty cycles of the first corrected clock signal CCLKI and the second corrected clock signal CCLKQ during the normal mode and may provide the relock signal RLK2 to the quadrature error correction circuit 400 in response to the duty error of the first corrected clock signal CCLKI and the second corrected clock signal CCLKQ being greater than a reference value.

The quadrature error correction circuit 400 may perform the relocking operation to lock the second corrected clock signal CCLKQ to the first corrected clock signal CCLKI in response to the relock signal RLK1 or the relock signal RLK2. The quadrature error correction circuit 400 may also perform the relocking operation to lock the second corrected clock signal CCLKQ to the first corrected clock signal CCLKI in response to the relock signal RLK3 which is generated in the quadrature error correction circuit 400.

Figure 27:
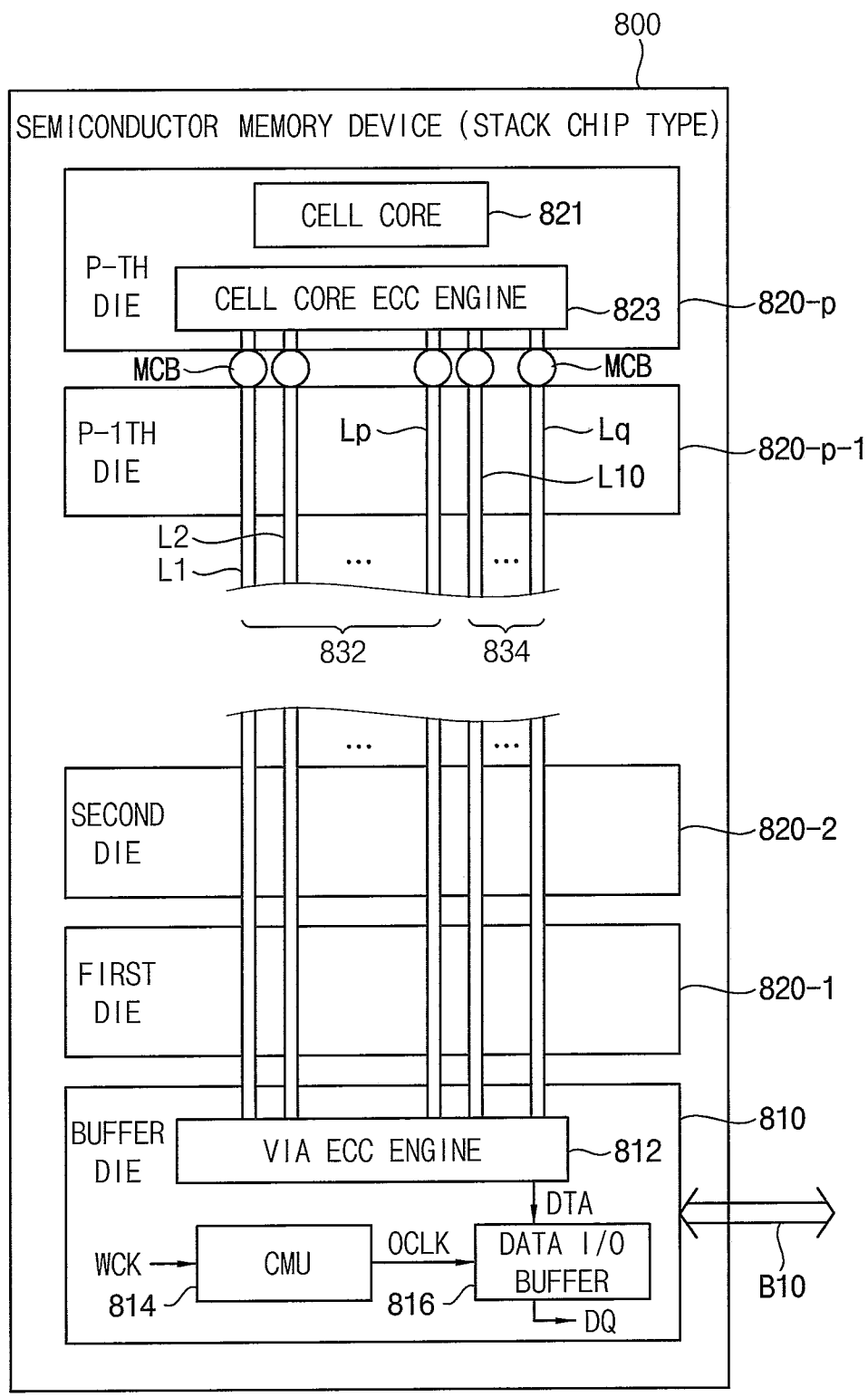
FIG. 27 is a block diagram illustrating a semiconductor memory device according to example embodiments.

FIG. 27 is a block diagram illustrating a semiconductor memory device 800 according to example embodiments.

Referring to FIG. 27, the semiconductor memory device 800 may include at least one buffer die 810 and a plurality of memory dies 820-1 to 820-$p$ ($p$ is a natural number equal to or greater than three) providing a soft error analyzing and correcting function in a stacked chip structure.

The plurality of memory dies 820-1 to 820-*p* are stacked on the buffer die 810 and convey data through a plurality of through silicon via (TSV) lines (e.g., L1, L2, Lp, and L10 . . . Lq).

At least one of the memory dies 820-1 to 820-*p* may include a cell core 821 to store data and a cell core ECC engine 823 which generates transmission parity bits (i.e., transmission parity data) based on transmission data to be sent to the at least one buffer die 810. The cell core 821 may include a plurality of memory cells having DRAM cell structure.

The buffer die 810 may include a via ECC engine 812 which corrects a transmission error using the transmission parity bits when a transmission error is detected from the transmission data received through the TSV lines and generates error-corrected data.

The buffer die 810 may further include a clock management unit (CMU) 814 and a data I/O buffer 816. The CMU 814 may employ the quadrature error correction circuit 400 of FIG. 7 and the clock generation circuit 600 of FIG. 17, may generate corrected clock signals whose phases are locked by performing a locking operation in a first operation mode and by performing a relocking operation based on the data clock signal WCK and may generate the output clock signal OCLK based on the corrected clock signals. The data I/O buffer 816 may generate the data signal DQ by sampling the data DTA from the via ECC engine 812 and may output the data signal DQ.

The semiconductor memory device 800 may be a stack chip type memory device or a stacked memory device which conveys data and control signals through the TSV lines. The TSV lines may be also called 'through electrodes'.

The cell core ECC engine 823 may perform error correction on data which is outputted from the memory die 820-*p* before the transmission data is sent.

A data TSV line group 832 which is formed at one memory die 820-*p* may include 128 TSV lines L1 to Lp, and a parity TSV line group 834 may include 8 TSV lines L10 to Lq. The TSV lines L1 to Lp of the data TSV line group 832 and the parity TSV lines L10 to Lq of the parity TSV line group 834 may be connected to micro bumps MCB which are correspondingly formed among the memory dies 820-1 to 820-*p*.

The semiconductor memory device 800 may have a three-dimensional (3D) chip structure or a 2.5D chip structure to communicate with the host through a data bus B10. The buffer die 810 may be connected with the memory controller through the data bus B10.

According to example embodiments, as illustrated in FIG. 27, the cell core ECC engine 823 may be included in the memory die and the via ECC engine 812 may be included in the buffer die. Accordingly, it may be possible to detect and correct soft data fail (or a soft error). The soft data fail may include a transmission error which is generated due to noise when data is transmitted through TSV lines.

Figure 28:
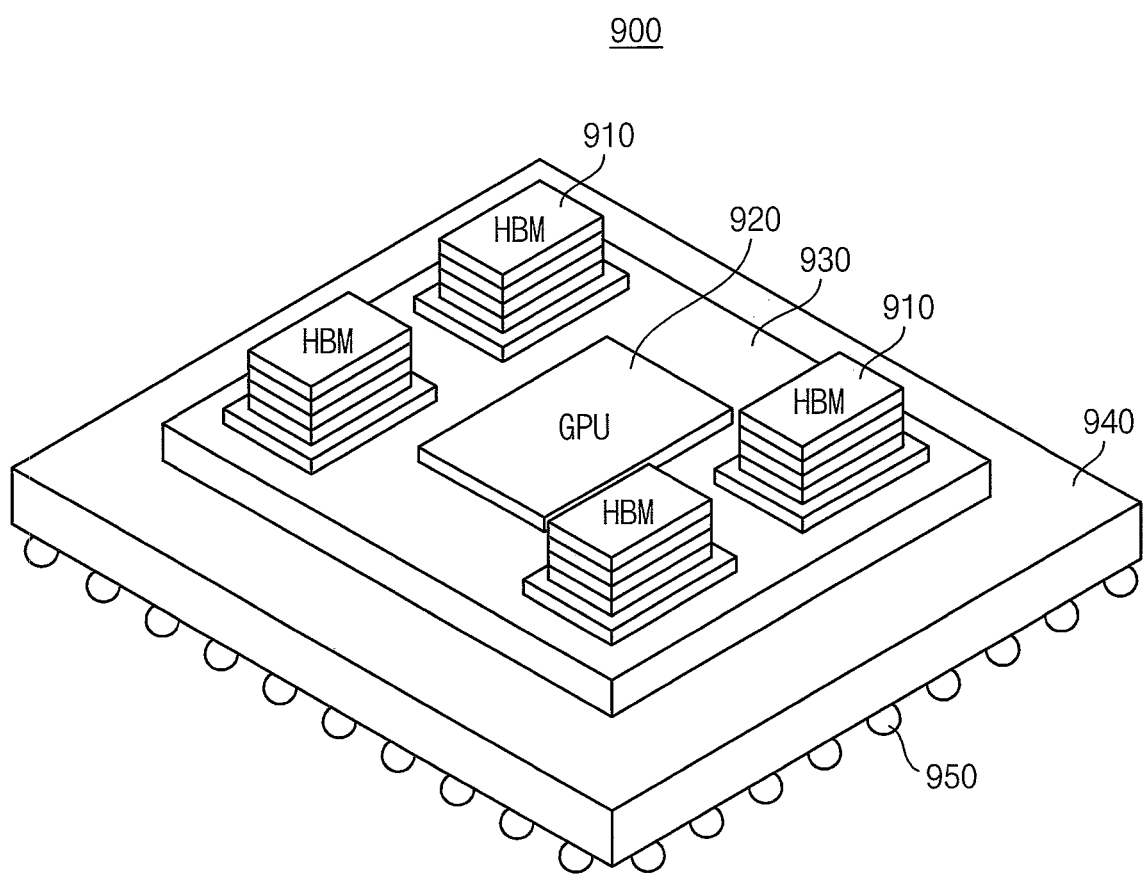
FIG. 28 is a configuration diagram illustrating a semiconductor package including stacked memory devices according to example embodiments.

FIG. 28 is a configuration diagram illustrating a semiconductor package 900 including stacked memory devices 910 according to example embodiments.

Referring to FIG. 28, the semiconductor package 900 may include one or more stacked memory devices 910 and a graphic processing unit (GPU) 920.

The stacked memory devices 910 and the GPU 920 may be mounted on an interposer 930, and the interposer 930 on which the stacked memory device 910 and the GPU 920 are mounted may be mounted on a package substrate 940 mounted on solder balls 950.

The GPU 920 may correspond to a semiconductor device which may perform a memory control function, and for example, the GPU 920 may be implemented as an application processor (AP).

The stacked memory device 910 may be implemented in various forms, and the stacked memory device 910 may be a memory device in a high bandwidth memory (HBM) form in which a plurality of layers are stacked. The stacked memory device 910 may include a buffer die and a plurality of memory dies and the buffer die may include the above-mentioned quadrature error correction circuit 400 and a clock generation circuit 600. Accordingly, the configuration of the stacked memory device 910 may be substantially the same as the configuration of the semiconductor memory device 800.

The plurality of stacked memory devices 910 may be mounted on the interposer 930, and the GPU 920 may communicate with the plurality of stacked memory devices 910. For example, each of the stacked memory devices 910 and the GPU 920 may include a physical region, and communication may be performed between the stacked memory devices 910 and the GPU 920 through the physical regions. Meanwhile, when the stacked memory device 910 includes a direct access region, a test signal may be provided into the stacked memory device 910 through conductive means (e.g., solder balls 950) mounted under package substrate 940 and the direct access region.

Aspects of the present inventive concept may be applied to systems using semiconductor memory devices that employ volatile memory cells and data clock signals. For example, aspects of the present inventive concept may be applied to systems such as be a smart phone, a navigation system, a notebook computer, a desk top computer and a game console that use the semiconductor memory device as a working memory.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the present inventive concept. Accordingly, all such modifications are intended to be included within the scope of the present inventive concept as defined in the claims.

What is claimed is:

1. A semiconductor memory device comprising:
   a quadrature error correction circuit configured to perform a relocking operation to lock a second corrected clock signal to a first corrected clock signal in response to a relock signal in a second operation mode, wherein the first corrected clock signal and the second corrected clock signal have a phase difference of 90 degrees with respect to each other and are generated based on first through fourth clock signals in a first operation mode;
   a clock generation circuit configured to generate an output clock signal and a strobe signal based on the first corrected clock signal and the second corrected clock signal; and
   a data input/output (I/O) buffer configured to generate a data signal by sampling data from a memory cell array based on the output clock signal and configured to transmit the data signal and the strobe signal to an external memory controller.

2. The semiconductor memory device of claim 1, wherein the quadrature error correction circuit is configured to perform the relocking operation in response to the relock signal generated inside of the semiconductor memory device.

3. The semiconductor memory device of claim 2, further comprising:
a duty cycle monitor configured to monitor duty cycles of the first corrected clock signal and the second corrected clock signal and configured to provide the relock signal to the quadrature error correction circuit based on a result of the monitoring.

4. The semiconductor memory device of claim 3, wherein the duty cycle monitor is configured to provide the relock signal to the quadrature error correction circuit when at least one of the duty cycles of the first corrected clock signal and the second corrected clock signal exceeds a reference value.

5. The semiconductor memory device of claim 3, wherein the duty cycle monitor is configured to provide the relock signal to the quadrature error correction circuit periodically.

6. The semiconductor memory device of claim 1, wherein the quadrature error correction circuit includes:
a delay circuit configured to generate first through fourth adjusted clock signals by adjusting delays of the second through fourth clock signals with respect to the first clock signal, based on first through third control code sets;
a phase interpolator configured to generate a delayed selected clock signal by delaying a second selection clock signal having a phase difference of 90 degrees with respect to a first selected clock signal, based on a fourth control code set, the first selected clock signal and the second selected clock signal being selected from among the first through fourth adjusted clock signals;
a phase detector configured to detect a phase difference between the first selected clock signal and the delayed selected clock signal to generate an up/down signal and configured to generate the relock signal based on the phase difference between the first selected clock signal and the delayed selected clock signal in the second operation mode; and
a delay control circuit configured to generate the first through fourth control code sets based on the up/down signal and configured to adjust the first through fourth control code sets based on the relock signal in the second operation mode.

7. The semiconductor memory device of claim 6, wherein the phase detector is configured to:
apply the relock signal to the delay control circuit based on the detected phase difference in the second operation mode; and
output a lock flag with a low level, which indicates that the second corrected clock signal is locked to the first corrected clock signal.

8. The semiconductor memory device of claim 6, wherein the phase detector is configured to apply the relock signal to the delay control circuit when the detected phase difference is equal to or greater than a reference value in the second operation mode.

9. The semiconductor memory device of claim 6, wherein the delay circuit includes:
a first delay line configured to output the first adjusted clock signal by delaying the first clock signal by a fixed delay amount;
a second delay line configured to output the second adjusted clock signal by delaying the second clock signal based on the first control code set;
a third delay line configured to output the third adjusted clock signal by delaying the third clock signal based on the second control code set; and
a fourth delay line configured to output the fourth adjusted clock signal by delaying the fourth clock signal based on the third control code set.

10. The semiconductor memory device of claim 9, wherein the delay control circuit includes:
a first delay controller configured to adjust code values of the first control code set based on the up/down signal to provide the first control code set to the second delay line;
a second delay controller configured to adjust code values of the second control code set based on the up/down signal to provide the second control code set to the third delay line;
a third delay controller configured to adjust code values of the third control code set based on the up/down signal to provide the third control code set to the fourth delay line; and
a fourth delay controller configured to adjust code values of the fourth control code set based on the up/down signal to provide the fourth control code set to the phase interpolator.

11. The semiconductor memory device of claim 10, wherein each of the first through fourth delay controllers is configured to store code values therein in the first operation mode and is configured to adjust code values of respective ones of the first through fourth control code sets based on the code value stored therein, in the second operation mode.

12. The semiconductor memory device of claim 1, further comprising:
a control logic circuit configured to control operations of the semiconductor memory device based on one or more commands received from the memory controller,
wherein the control logic circuit is configured to apply the relock signal to the quadrature error correction circuit in response to a command from the memory controller designating the relocking operation in the second operation mode.

13. The semiconductor memory device of claim 12, wherein the memory controller is configured to designate the relocking operation in the second operation mode based on monitoring the strobe signal.

14. The semiconductor memory device of claim 13, wherein the memory controller is configured to designate the relocking operation periodically in the second operation mode.

15. The semiconductor memory device of claim 1, wherein the quadrature error correction circuit is configured to perform the relocking operation based on a linear search in the second operation mode.

16. A memory system comprising:
a semiconductor memory device; and
a memory controller configured to control the semiconductor memory device,
wherein the semiconductor memory device includes:
a quadrature error correction circuit configured to perform a relocking operation to lock a second corrected clock signal to a first corrected clock signal based on a first command from the memory controller in a second operation mode, wherein the first corrected clock signal and the second corrected clock signal have a phase difference of 90 degrees with respect to each other and are generated based on first through fourth clock signals in a first operation mode.

17. The memory system of claim 16,
wherein the memory controller includes a duty cycle detector configured to detect a duty cycle of a strobe signal periodically or non-periodically and configured to transmit, to the semiconductor memory device, the first command designating the relocking operation based on the detected duty cycle, and wherein the quadrature error correction circuit is configured to perform the relocking operation in the second operation mode based on the first command designating the relocking operation.

18. The memory system of claim 16, wherein the semiconductor memory device further includes:

a clock generation circuit configured to generate an output clock signal and a strobe signal based on the first corrected clock signal and the second corrected clock signal; and a data input/output (I/O) buffer configured to generate a data signal by sampling data from a memory cell array based on the output clock signal and configured to transmit the data signal and the strobe signal to the memory controller.

19. A method of operating a semiconductor memory device including a quadrature error correction circuit, the method comprising:

generating a first code by performing a locking operation, in the quadrature error correction circuit, in response to an initialization command;

storing the first code in each of plurality of delay controllers in the quadrature error correction circuit;

generating a relock signal based on detecting a duty error between a data clock single and a strobe signal which is generated based on a first corrected clock signal and a second corrected clock signal which are generated based on the first code;

generating a second code by performing a relocking operation in response to the relock signal, in the quadrature error correction circuit;

storing the second code in each of the plurality of delay controllers; and locking the second corrected clock signal to the first corrected clock signal based on the second code.

\* \* \* \* \*